(12) United States Patent
Hui et al.

(10) Patent No.: US 12,543,451 B2
(45) Date of Patent: Feb. 3, 2026

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yan Hui, Beijing (CN); Quan Shi, Beijing (CN); Jun Li, Beijing (CN); Haibo Li, Beijing (CN); Rui Zhou, Beijing (CN); Po Li, Beijing (CN); Huan Tao, Beijing (CN); Yingbing Chen, Beijing (CN); Nan Zhang, Beijing (CN); Xiaonan Liu, Beijing (CN); Lei Zhang, Beijing (CN); Yankai Lu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 387 days.

(21) Appl. No.: 18/272,636

(22) PCT Filed: Jun. 30, 2022

(86) PCT No.: PCT/CN2022/102848
§ 371 (c)(1),
(2) Date: Jul. 17, 2023

(87) PCT Pub. No.: WO2024/000415
PCT Pub. Date: Jan. 4, 2024

(65) Prior Publication Data
US 2024/0414946 A1 Dec. 12, 2024

(51) Int. Cl.
*H10K 59/00* (2023.01)
*H10K 59/12* (2023.01)
(Continued)

(52) U.S. Cl.
CPC ....... *H10K 59/122* (2023.02); *H10K 59/1201* (2023.02)

(58) Field of Classification Search
CPC .. H10K 59/122; H10K 59/1201; H10K 59/00; H10K 71/00
(Continued)

(56) References Cited

U.S. PATENT DOCUMENTS

2019/0198812 A1 6/2019 Lee et al.
2020/0343322 A1 10/2020 Jia et al.
(Continued)

FOREIGN PATENT DOCUMENTS

| CN | 108717942 A | 10/2018 |
|---|---|---|
| CN | 110752244 A | 2/2020 |

(Continued)

*Primary Examiner* — Joseph L Williams
(74) *Attorney, Agent, or Firm* — Scully, Scott, Murphy & Presser, P.C.

(57) ABSTRACT

A display substrate and a manufacturing method thereof, and a display device are provided. The display substrate includes: a base substrate, a plurality of sub-pixels, a pixel defining layer, and a planarization layer. The pixel defining layer includes a main body portion, the main body portion includes a first main body sub-portion and a second main body sub-portion, the second main body sub-portion protrudes relative to the first main body sub-portion to form a separation structure, at least one of the plurality of film layers is broken at the separation structure, an orthographic projection of a part of the light-emitting functional layer in the opening on the base substrate at least partially overlaps with an orthographic projection of a part of the light- (Continued)

emitting functional layer located on a side of the main body portion away from the base substrate on the base substrate.

20 Claims, 10 Drawing Sheets

(51) Int. Cl.
  *H10K 59/122* (2023.01)
  *H10K 71/00* (2023.01)
(58) Field of Classification Search
  USPC .................. 445/24, 25, 50, 51; 313/498–506
  See application file for complete search history.

(56) References Cited

U.S. PATENT DOCUMENTS

| | | | |
|---|---|---|---|
| 2021/0005835 | A1 | 1/2021 | Wang et al. |
| 2021/0359249 | A1* | 11/2021 | Zhang ................. H10K 59/122 |
| 2022/0149126 | A1 | 5/2022 | Sung et al. |
| 2022/0376204 | A1 | 11/2022 | Lin et al. |
| 2022/0384531 | A1 | 12/2022 | Xu et al. |
| 2024/0206234 | A1* | 6/2024 | Guo ..................... H10K 59/124 |
| 2025/0234710 | A1* | 7/2025 | Wang ................... H10K 59/122 |

FOREIGN PATENT DOCUMENTS

| | | | | | |
|---|---|---|---|---|---|
| CN | 111180497 | A | | 5/2020 | |
| CN | 111564484 | A | | 8/2020 | |
| CN | 112242494 | A | | 1/2021 | |
| CN | 112670332 | A | | 4/2021 | |
| CN | 212874542 | U | | 4/2021 | |
| CN | 112909061 | A | | 6/2021 | |
| CN | 113178524 | A | | 7/2021 | |
| CN | 113285044 | A | * | 8/2021 | ........... H10K 50/865 |
| CN | 113299717 | A | | 8/2021 | |
| CN | 114464654 | A | | 5/2022 | |
| CN | 114631191 | A | | 6/2022 | |
| CN | 114628405 | B | | 4/2023 | |
| CN | 116209311 | A | | 6/2023 | |
| CN | 116209312 | A | | 6/2023 | |
| CN | 116209313 | A | | 6/2023 | |
| CN | 116209314 | A | | 6/2023 | |
| CN | 114628449 | B | | 8/2023 | |
| CN | 114628451 | B | | 1/2024 | |

* cited by examiner

DISPLAY SUBSTRATE AND MANUFACTURING METHOD THEREOF, AND DISPLAY DEVICE

CROSS-REFERENCE TO RELATED APPLICATION

This application is a U.S. National Phase of International Application No. PCT/CN2022/102848, filed on Jun. 30, 2022, the entire disclosure of which is incorporated herein by reference as part of the present application.

TECHNICAL FIELD

At least one embodiment of the present disclosure relates to a display substrate and a manufacturing method thereof, and a display device.

BACKGROUND

With the development of display technology, users have higher and higher requirements on performance of a display device. In some products, performance requirements of high brightness and low power consumption of the display device can be met as far as possible by broking a material layer for light-emitting between adjacent sub-pixels to alleviate signal crosstalk, so that the display performance is optimized.

SUMMARY

At least one embodiment of the present disclosure provides a display substrate and a manufacturing method thereof, and a display device.

The embodiments of the present disclosure provide a display substrate, the display substrate includes: a base substrate, a plurality of sub-pixels, a pixel defining layer, and a planarization layer. Each of the plurality of sub-pixels includes a light-emitting element, the light-emitting element includes a light-emitting functional layer, and a first electrode and a second electrode that are located on both sides of the light-emitting functional layer in a direction perpendicular to the base substrate, the first electrode is located between the light-emitting functional layer and the base substrate, and the light-emitting functional layer includes a plurality of film layers; the pixel defining layer includes a main body portion and a plurality of openings, each of the plurality of the openings is defined by the main body portion, and the opening exposes at least a part of the first electrode; and the planarization layer is arranged between the base substrate and the pixel defining layer, the main body portion includes a first main body sub-portion and a second main body sub-portion, the first main body sub-portion is located on a side of the second main body sub-portion close to the base substrate, the second main body sub-portion protrudes relative to the first main body sub-portion to form a separation structure, at least one of the plurality of film layers is broken at the separation structure of the main body portion, an orthographic projection of a part of the light-emitting functional layer that is on a side of a part of the first electrode located in the opening away from the base substrate on the base substrate at least partially overlaps with an orthographic projection of a part of the light-emitting functional layer located on a side of the main body portion away from the base substrate on the base substrate.

For example, according to the embodiments of the present disclosure, for a same opening, the separation structure in the pixel defining layer is arranged in unclosed ring-shape in a circumferential direction of the opening, and second electrodes of adjacent light-emitting elements are at least partially connected at a notch of the unclosed ring-shape, a length of the notch of the unclosed ring-shape is 5-20 microns.

For example, according to the embodiments of the present disclosure, the minimum slope angle between at least part of a side surface of the second main body sub-portion and a plane parallel to the base substrate is in a range from 60° to 90°.

For example, according to the embodiments of the present disclosure, in an arrangement direction of adjacent sub-pixels, the minimum dimension of the opening is 1.2-1.5 times the maximum dimension of the first main body sub-portion.

For example, according to the embodiments of the present disclosure, in an arrangement direction of adjacent sub-pixels, the maximum dimension of the first main body sub-portion is 0.4-0.8 times the maximum dimension of the second main body sub-portion; in the direction perpendicular to the base substrate 01, the maximum dimension N1 of the first main body sub-portion 10011 is 1-1.8 times the maximum dimension N2 of the second main body sub-portion 10012.

For example, according to the embodiments of the present disclosure, the first electrode includes a crystallized conductive metal oxide.

For example, according to the embodiments of the present disclosure, an orthographic projection of a part of the light-emitting functional layer on a side of the second main body sub-portion away from the base substrate on the base substrate, at least partially overlaps with an orthographic projection of a part of the light-emitting functional layer located in the opening on the base substrate.

For example, according to the embodiments of the present disclosure, an orthographic projection of a part of the second electrode on a side of the second main body sub-portion away from the base substrate on the base substrate, at least partially overlaps with an orthographic projection of a part of the second electrode located in the opening on the base substrate.

For example, according to the embodiments of the present disclosure, the separation structure includes a groove, and the light-emitting functional layer extends into the groove; the display substrate further includes a residual portion, the residual portion is located in the groove, and an orthographic projection of the residual portion on the base substrate falls within an orthographic projection of the separation structure on the base substrate.

The embodiments of the present disclosure further provide a display device, including any one of the display substrates as described above.

The embodiments of the present disclosure further provide a manufacturing method of a display substrate, including: forming a planarization layer on the base substrate; forming a first conductive film on the planarization layer, and patterning the first conductive film to form a first electrode; forming a second conductive film on the first electrode, and patterning the second conductive film to form a sacrificial structure; forming a pixel defining film on the sacrificial structure, and patterning the pixel defining film to form a pixel defining layer, the pixel defining layer including a main body portion and a plurality of openings, each of the plurality of openings exposing at least a part of the first electrode; removing the sacrificial structure so that the main body portion includes a first main body sub-portion and a second main body sub-portion, the first main body sub-portion being located on a side of the second main body sub-portion close to the base substrate, and the second main body sub-portion protruding relative to the first main body sub-portion to form a separation structure in the main body portion; forming a light-emitting functional layer and a second electrode sequentially on the pixel defining layer; the light-emitting functional layer includes a plurality of film layers, at least one of the plurality of film layers is broken at the separation structure, the separation structure includes a groove, and the light-emitting functional layer extends into the groove.

For example, according to the embodiments of the present disclosure, forming the first electrode includes: forming a first spacing region between adjacent first electrodes; forming the sacrificial structure includes: forming a second spacing region between adjacent sacrificial structures, in an arrangement direction of adjacent sub-pixels, an orthographic projection of the first spacing region on the base substrate falls within an orthographic projection of the second spacing region on the base substrate, and the minimum dimension of the second spacing region is greater than or equal to the minimum dimension of the first spacing region.

For example, according to the embodiments of the present disclosure, in an arrangement direction of adjacent sub-pixels, the minimum dimension of the opening is smaller than the minimum dimension of the sacrificial structure, and an orthographic projection of the opening on the base substrate falls within an orthographic projection of the sacrificial structure on the base substrate.

For example, according to the embodiments of the present disclosure, the manufacturing method further includes: forming a support structure located on a side of the pixel defining layer away from the base substrate, an orthographic projection of the support structure on the base substrate at least partially overlaps with an orthographic projection of the second spacing region on the base substrate.

For example, according to the embodiments of the present disclosure, a thickness of the second conductive film is 1-3 times a thickness of the first conductive film; a thickness of the pixel defining film is 3-8 times the thickness of the second conductive film.

For example, according to the embodiments of the present disclosure, a material of the first conductive film includes conductive metal oxide, and a material of the second conductive film includes metal.

For example, according to the embodiments of the present disclosure, the conductive metal oxide includes indium tin oxide; the metal includes any one of aluminum, silver, and a metal stacked layer formed of titanium/aluminum/titanium.

For example, according to the embodiments of the present disclosure, after forming the sacrificial structure and before removing the sacrificial structure, the manufacturing method further includes: performing heat treatment on the display substrate to crystallize the first electrode.

For example, according to the embodiments of the present disclosure, removing the sacrificial structure includes: etching and removing the sacrificial structure by using a wet etching process.

For example, according to the embodiments of the present disclosure, the material of the second conductive film includes metal, and etching and removing the sacrificial structure by using a wet etching process includes: using an acidic etching solution to etch an intermediate film layer made of the metal.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
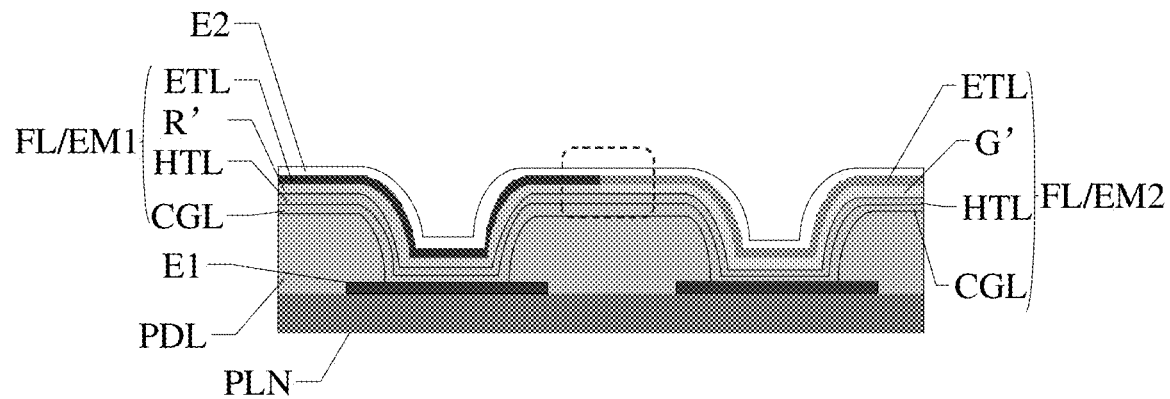
FIG. 1 is a schematic cross-sectional view of a display substrate.

For more clear understanding of the objectives, technical details and advantages of the embodiments of the present disclosure, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise", "comprising", "include", "including", etc., are intended to specify that the elements or the objects stated before these terms encompass the elements or the objects and equivalents thereof listed after these terms, but do not preclude the other elements or objects.

The characteristics of "vertical" and "same" used in the embodiment of the present disclosure all include the characteristics of "vertical" and "same" in a strict sense and the cases of "approximately vertical" and "approximately same" containing certain errors. Considering the measurement and the errors related to the measurement of a specific quantity (that is, the limitations of the measurement system), it refers to within the acceptable deviation range for a specific value determined by a person of ordinary skill in the art. The "center" in the embodiment of the present disclosure may include a strictly geometric center position and a roughly central position in a small area around the geometric center. For example, "approximately" may refer to within one or more standard deviations, or within 10% or 5% of the stated value.

With the continuous development of display technology, a new generation goal of achieving low power consumption and high quality puts forward higher and higher requirements for the development of a display device. As an emerging OLED display substrate structure, the tandem structure replaces one light-emitting layer in the light-emitting element in the OLED display substrate with two light-emitting layers, and adds a charge-generating layer (CGL) between the two light-emitting layers to form a double-stacked design and realize a series connection of double light-emitting components. Compared with a traditional OLED display substrate adopting light-emitting element with one light-emitting functional layer, under the same light-emitting intensity, the display substrate adopting the tandem structure greatly reduces light-emitting current of the light-emitting element and improves life of the light-emitting element, which is beneficial to development and mass production of long-life new technologies such as a vehicle. A display device with the tandem structure has advantages of long life, low power consumption, and high brightness.

FIG. 1 is a schematic cross-sectional view of a display substrate. As illustrated in FIG. 1, the display substrate includes a planarization layer PLN, a pixel defining layer PDL, an electrode E1, a light-emitting functional layer FL, and an electrode E2. The light-emitting functional layer FL includes a charge-generating layer (CGL), a hole transportation layer HTL, a light-emitting layer, and an electron transportation layer ETL. FIG. 1 illustrates a light-emitting element EM1 and a light-emitting element EM2 of adjacent sub-pixels, the light-emitting element EM1 is configured to emit red light, and the light-emitting element EM2 is configured to emit green light. That is, the light-emitting element EM1 corresponds to a light-emitting layer R' that emits red light, and the light-emitting element EM2 corresponds to a light-emitting layer G' that emits green light. As illustrated in FIG. 1, charge-generating layers (CGL) of the light-emitting element EM1 and the light-emitting element EM2 may have an integrated structure and be manufactured by adopting an open mask. It should be noted that, for the sake of clarity, FIG. 1 only illustrates part of the film layers in the display substrate, for example, the display substrate further includes a plurality of other film layers, such as an encapsulation layer, and the like.

However, with the continuous improvement of product resolution, a spacing of pixel defining layers between pixels in the display substrate continues to shrink. At the same time, because the charge-generating layer (CGL) in the light-emitting element has strong conductivity, in the case where the charge-generating layer (CGL) is arranged as an entire film layer, charge-generating layers (CGL) of two adjacent organic light-emitting elements can be of a continuous film layer, which makes it easy to generate crosstalk, for example, at a low gray level, a green sub-pixel may drive a red sub-pixel that is adjacent thereto to emit light. Moreover, in an existing display substrate, a light-emitting region of the light-emitting element is defined by the pixel defining layer PDL, the larger an area of the light-emitting region, the higher the light-emitting intensity of the light-emitting element, which is more conducive to improving the display performance of the display substrate.

At least one embodiment of the present disclosure provides a display substrate, including: a base substrate, a plurality of sub-pixels, a pixel defining layer, and a planarization layer. Each of the plurality of sub-pixels includes a light-emitting element, the light-emitting element includes a light-emitting functional layer, and a first electrode and a second electrode that are located on both sides of the light-emitting functional layer in a direction perpendicular to the base substrate, the first electrode is located between the light-emitting functional layer and the base substrate, and the light-emitting functional layer includes a plurality of film layers; the pixel defining layer includes a main body portion and a plurality of openings, the opening is defined by the body portion, and the opening exposes at least a part of the first electrode; the planarization layer is arranged between the base substrate and the pixel defining layer, the main body portion includes a first main body sub-portion and a second main body sub-portion, the first main body sub-portion is located on a side of the second main body sub-portion close to the base substrate, the second main body sub-portion protrudes relative to the first main body sub-portion to form a separation structure, at least one of the plurality of film layers is broken at the separation structure of the main body portion; an orthographic projection of a part of the light-emitting functional layer that is on a side of a part of the first electrode located in the opening away from the base substrate on the base substrate at least partially overlaps with an orthographic projection of a part of the light-emitting functional layer that is located on a side of the main body portion away from the base substrate on the base substrate.

In the embodiment of the present disclosure, by arranging the separation structure between adjacent sub-pixels in the display substrate, at least one of the plurality of film layers of the light-emitting functional layer can be broken at the separation structure, which is beneficial to reducing a probability of crosstalk between adjacent sub-pixels, and is beneficial to meeting an arrangement requirement of a high pixel density, so as to improve the display performance of the display substrate.

The display substrate and the display device provided by the embodiments of the present disclosure will be described below with reference to the accompanying drawings.

Figure 2:
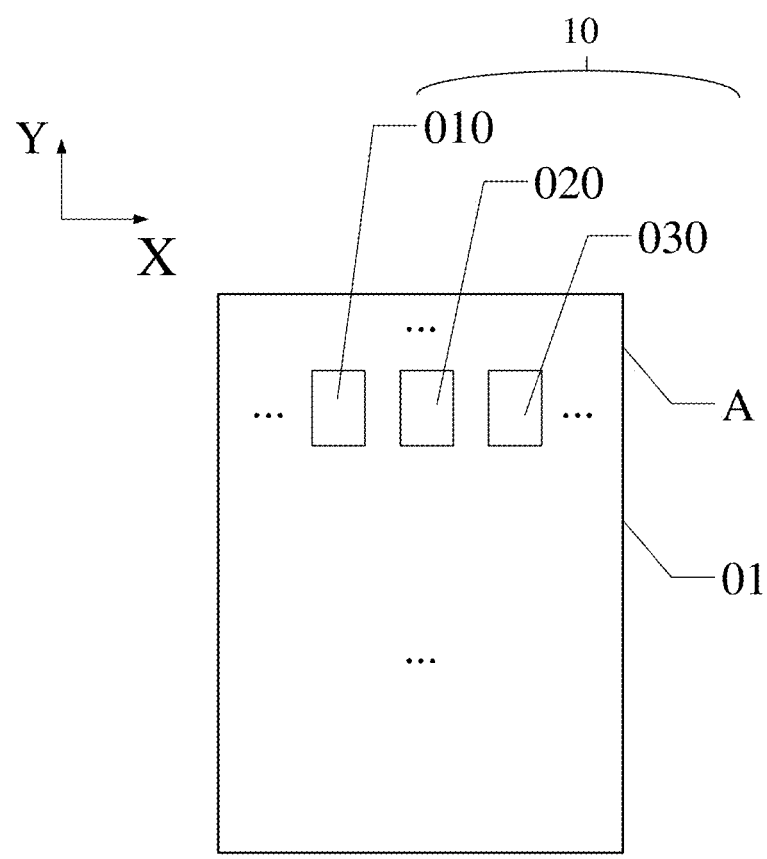
FIG. 2 is a plan view of a display substrate provided by an embodiment of the present disclosure.
Figure 3:
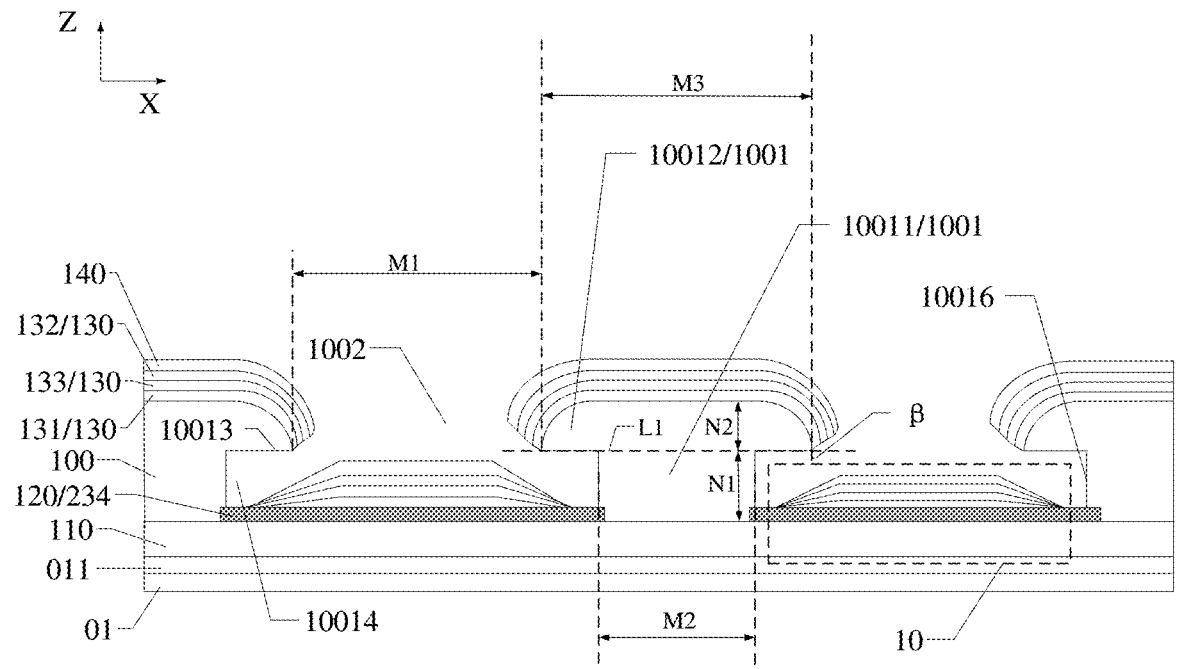
FIG. 3 is a cross-sectional view of a display substrate provided by at least one embodiment of the present disclosure.

FIG. 2 is a plan view of a display substrate provided by an embodiment of the present disclosure. FIG. 3 is a cross-sectional view of a display substrate provided by at least one embodiment of the present disclosure.

Referring to FIG. 2 and FIG. 3, a display substrate includes a base substrate 01, a plurality of sub-pixels 10, a pixel defining layer 100, and a planarization layer 110. For example, the display substrate includes a display region A located on the base substrate 01, and the plurality of sub-pixels 10, such as a plurality of first sub-pixels 010, a plurality of second sub-pixels 020 and a plurality of third sub-pixels 030, are located in the display region A, the plurality of sub-pixels 10 are arranged at intervals in the display region A to form a plurality of pixel rows and a plurality of pixel columns.

For example, the planarization layer 110 may be an insulating layer, and a material of the insulating layer may include an organic material. For example, the planarization layer 110 may be a structure including at least one layer, for example, may be an insulating layer including two layers, but is not limited thereto.

Referring to FIG. 2 and FIG. 3, each sub-pixel in the plurality of sub-pixels 10 includes a light-emitting element 234, and the light-emitting element 234 includes a light-emitting functional layer 130, and a first electrode 120 and a second electrode 140 that are located on both sides of the light-emitting functional layer 130 in a direction perpendicular to the base substrate 01, the first electrode 120 is located between the light-emitting functional layer 130 and the base substrate 01, the light-emitting functional layer 130 includes a plurality of film layers, for example, the plurality of film layers include a charge-generating layer 133 as illustrated in FIG. 3, and a first light-emitting layer 131 and a second light-emitting layer 132 that are located on both sides of the charge-generating layer 133. For example, the light-emitting element 234 is configured to drive the sub-pixel 234 to emit light.

As illustrated in FIG. 3, the pixel defining layer 100 includes a main body portion 1001 and a plurality of openings 1002, the opening 1002 is defined by the main body portion 1001, and the opening 1002 exposes at least a part of the first electrode 120. The planarization layer 110 is arranged between the base substrate 01 and the pixel defining layer 100, the main body portion 1001 includes a first main body sub-portion 10011 and a second main body sub-portion 10012, and the first main body sub-portion 10011 is located on a side of the second main body sub-portion 10012 close to the base substrate 01, the second main body sub-portion 10012 protrudes relative to the first main body sub-portion 10011 to form a separation structure 10013.

As illustrated in FIG. 3, at least one of the plurality of film layers in the light-emitting functional layer 130 is broken at the separation structure 10013 of the main body portion 1001, an orthographic projection of a part of the light-emitting functional layer 130 that is on a side of a part of the first electrode 120 located in the opening 1002 away from the base substrate 01 on the base substrate 01 at least partially overlaps with an orthographic projection of a part of the light-emitting functional layer 130 that is located on a side of the main body portion 1001 away from the base substrate 01 on the base substrate 01.

As illustrated in FIG. 3, the separation structure 10013 includes a groove 10014, and the light-emitting functional layer 130 can extend into the groove 10014.

In the embodiments of the present disclosure, at least one film layer of the light-emitting functional layer 130 is broken at the separation structure 10013 between adjacent sub-pixels 10, which is beneficial to reducing crosstalk between adjacent sub-pixels to optimize display effect.

For example, as illustrated in FIG. 3, the planarization layer 110 may adopt a light-transmitting insulating material to enhance a transmittance of the display substrate.

For example, as illustrated in FIG. 3, the plurality of sub-pixels 10 may include two adjacent sub-pixels 10 arranged in an X direction. For example, the adjacent sub-pixels have an arrangement direction, which can be roughly an extension direction of a center line or the shortest distance line of light-emitting regions of the adjacent sub-pixels, alternatively, the light-emitting regions of the adjacent sub-pixels are distributed in the X direction, that is, the above-mentioned direction is the X direction.

For example, as illustrated in FIG. 3, the light-emitting functional layer 130 may include a first light-emitting layer 131, a charge-generating layer 133, and a second light-emitting layer 132 that are arranged in stacked layers. The charge-generating layer 133 has strong conductivity, which can make the light-emitting functional layer has advantages of long life, low power consumption, and high brightness. For example, compared with a light-emitting functional layer without a charge-generating layer, the light-emitting brightness of the sub-pixel 10 can be nearly doubled by providing the charge-generating layer 133 in the light-emitting functional layer 130. For example, in each sub-pixel 10, the light-emitting functional layer 130 may further include a hole injection layer (HIL), a hole transportation layer (HTL), an electron transportation layer (ETL), a light coupling layer CPL, and an electron injection layer (EIL) and so on. For example, above-mentioned film layers are common film layers of the plurality of sub-pixels 10, which can be referred to as common layers.

For example, as illustrated in FIG. 3, in the same sub-pixel 10, the first light-emitting layer 131 and the second light-emitting layer 132 may be light-emitting layers that emit light of the same color. For example, the first light-emitting layers 131 (or the second light-emitting layers 132) in the sub-pixels 10 emitting light of different colors emit light of different colors. Of course, the embodiments of the present disclosure are not limited thereto. For example, in the same sub-pixel 10, the first light-emitting layer 131 and the second light-emitting layer 132 can be light-emitting layers that emit light of different colors, and light emitted by the plurality of light-emitting layers included in the sub-pixel 10 can mix into white light by arranging light-emitting layers in the same sub-pixel 10 emitting light of different colors, and the color of the light emitted by each sub-pixel can be adjusted by arranging a color filter layer.

For example, as illustrated in FIG. 3, the first electrode 110 may be an anode, and the second electrode 120 may be a cathode. For example, the cathode can be formed of a material with high conductivity and low work function, for example, the cathode can be made of a metal material. For example, the anode may be formed of a transparent conductive material with a high work function.

For example, as illustrated in FIG. 3, the pixel defining layer 100 is located on a side of the first electrode 120 of the light-emitting element 234 away from the base substrate 01, and the pixel defining layer 100 includes a plurality of openings 1002 and a main body portion 1001 surrounding the plurality of openings 1002, the plurality of light-emitting elements 234 are at least partially located in the plurality of openings 1002. FIG. 3 schematically illustrates that a structural layer 011 is further provided at a side of the first electrode 120 of the light-emitting element 234 away from the second electrode 140. For example, the structural layer 011 may include a layer where an active semiconductor pattern is located, a film layer where a gate line is located, a film layer where a data line is located, a plurality of insulating layers and other film layers. For example, the material of the pixel defining layer 100 may include polyimide, acrylic, or polyethylene terephthalate and so on.

For example, as illustrated in FIG. 3, the opening 1002 of the pixel defining layer 100 is configured to define the light-emitting region of the light-emitting element 234. For example, the light-emitting elements 234 of the plurality of sub-pixels 10 may be arranged in one-to-one correspondence with the plurality of openings 1002. For example, the light-emitting element 234 may include a portion located in the opening 1002 and a portion overlapping with the main body portion 1001 in the direction perpendicular to the base substrate 01.

For example, as illustrated in FIG. 3, the opening 1002 of the pixel defining layer 100 is configured to expose the first electrode 120 of the light-emitting element 234, and the first electrode 120 that is exposed is at least partially in contact with the light-emitting functional layer 130 in the light-emitting element 234. For example, in the case where the light-emitting functional layer 130 is located in the opening 1002 of the pixel defining layer 100, the first electrode 120 and the second electrode 140 located on both sides of the light-emitting functional layer 130 can drive the light-emitting functional layer 234 in the opening 1002 of the pixel defining layer 100 to emit light. For example, the above-mentioned light-emitting region may refer to an effective light-emitting region of the light-emitting element 234, and a shape of the light-emitting region refers to a two-dimensional shape. For example, a shape of the light-emitting region may be the same as a shape of the opening 1002 of the pixel defining layer 100.

For example, as illustrated in FIG. 3, the main body portion 1001 of the pixel defining layer 100 includes a first main body sub-portion 10011 and a second main body sub-portion 10012, and the first main body sub-portion 10011 is located on the side of the second main body sub-portion 10012 close to the base substrate 01. For example, the first main body sub-portion 10011 and the second main body sub-portion 10012 are integrally formed, but not limited thereto. For the same main body portion 1001, the second main body sub-region 10012 protrudes relative to the first main body sub-region 10011 in the X direction to form the separation structure 10013, thereby forming an undercut structure at an edge of the second main body sub-region 10012. For example, the main body portion 1001 after forming the undercut structure is approximately in a shape of a "mushroom".

As illustrated in FIG. 3, at least one of the plurality of film layers in the light-emitting functional layer 130 is broken at the separation structure 10013 of the main body portion 1001. For example, at least one film layer in the light-emitting functional layer 130 that is broken can be at least one film layer in the above-mentioned common layer. In this case, at least one film layer (such as a charge-generating layer) in the light-emitting functional layer of a sub-pixel is spaced apart from the least one film layer (such as a charge-generating layer) in the light-emitting functional layer of another sub-pixel adjacent thereto, which can increase a resistance of the light-emitting functional layer between adjacent sub-pixels, thereby reducing a probability of crosstalk generated between two adjacent sub-pixels, and in the case where the colors of emitting light of the adjacent sub-pixels are different, it is beneficial to improving color mixing of the display substrate, reducing power consumption, and prolonging the life of the display substrate.

As illustrated in FIG. 3, the light-emitting functional layer 130 includes a portion located in the opening 1002 and a portion arranged on the side of the main body portion 1001 away from the base substrate 01. In the case where the light-emitting functional layer 130 is broken at the separation structure 10013, for a part of the light-emitting functional layer 130 that is on the side of the first electrode 120 in the opening 1002 away from the base substrate 01, a thickness of the part of the light-emitting functional layer 130 located in a middle part of the opening 1002 is maximum, and a thickness of a part of the light-emitting functional layer 130 located at an edge of the opening 1002 gradually decreases.

As illustrated in FIG. 3, the separation structure 10013 includes a groove 10014, and the parts of the light-emitting functional layer 130 on both sides can extend into the groove 10014. The orthographic projection of a part of the light-emitting functional layer 130 that is on the side of a part of the first electrode 120 located in the opening 1002 away from the base substrate 01 on the base substrate 01 at least partially overlaps with the orthographic projection of a part of the light-emitting functional layer 130 that is located on the side of the main body portion 1001 away from the base substrate 01 on the base substrate 01. For example, for the part of the light-emitting functional layer 130 that is located on the side of a part of the first electrode 120 in the opening 1002 away from the base substrate 01, an orthographic projections of a part of the light-emitting functional layer 130 whose thickness gradually decreases on both sides of the opening 1002 at least partially overlaps with an orthographic projection of the part of the light-emitting functional layer 130 on the side of the main body portion 1001 away from the base substrate 01 on the base substrate 01, but are not limited thereto.

Referring to FIG. 3, for example, in the X direction, in the same opening 1002, the maximum dimension of the part of the light-emitting functional layer 130 extending into the groove 10014 is ⅕-⅓ of the maximum dimension of the light-emitting functional layer 130 in the opening. For example, in the X direction, the above dimension is ⅕-¼. For example, in the X direction, the above dimension is ¼-⅓. For example, in the X direction, the above dimension is ⅕-4/15.

For example, referring to FIG. 3, in the case where a part of the light-emitting functional layer 130 is located in the groove 10014 of the separation structure 10013, the part of the light-emitting functional layer 130 may at least partially overlap with a sidewall 10016 of the main body portion 1001, in this case, the second electrode 140 is arranged on the side of the light-emitting functional layer 130 away from the first electrode 120, the second electrode 140 and the first electrode 120 are spaced apart from each other through the light-emitting functional layer 130 to reduce a probability of short circuit.

For example, in the case where the main body portion 1001 between two adjacent sub-pixels 10 forms the separation structure 10013, the maximum dimension of the main body portion 1001 in the X direction can be reduced, so that the maximum dimension of the opening 1002 can be increased in the X direction, an aperture ratio of the pixel defining layer 100 becomes larger, so that the opening 1002 can expose a larger area of the light-emitting region in the light-emitting element 130, and at the same time, the spacing of pixel defining layers between pixels can be reduced to realize high resolution performance of the display substrate.

For example, as illustrated in FIG. 3, the minimum slope angle β between at least part of a side surface of the second main body sub-portion 10012 and a plane L1 parallel to the base substrate 01 is 60°-90°.

As illustrated in FIG. 3, the angle between at least part of a side surface of the second main body sub-portion 10012 and a plane L1 parallel to the base substrate 01 is a slope angle, and a slope angle between a side surface of an edge part of the second main body sub-portion 10012 and the plane L1 is the minimum slope angle β.

For example, the minimum slope angle β may be 60°-80°. For example, the minimum slope angle β may be 75°-95°. For example, the minimum slope angle β may be 70°-90°. For example, the minimum slope angle β may be 60 degrees. For example, the minimum slope angle β may be 65°-75°. For example, the minimum slope angle β may be 65°-85°. For example, the minimum slope angle β may be 75°-85°. For example, the minimum slope angle β may be 80°-95°. For example, the minimum slope angle β may be 60°-70°. For example, the minimum slope angle β may be 60°.

For example, the minimum slope angle β between at least part of the side surface of the second main body sub-portion 10012 and the plane L1 parallel to the base substrate 01 is arranged as 60°-90°, which is beneficial to making at least one film layer in the light-emitting element 234 be broken at the separation structure 10013, and at the same time, normal display of the sub-pixel 10 is not affected, which is beneficial to improving the display performance of the display substrate.

For example, as illustrated in FIG. 3, the minimum dimension M1 of the opening 1002 is 1.2-1.5 times the maximum dimension M2 of the first main body sub-portion 10011 in the arrangement direction of adjacent sub-pixels 10, for example, the X direction. That is, an opening area of the opening 1002 can be enlarged as much as possible, so that the area of the light-emitting region of the light-emitting element 234 can be increased to improve the display effect.

For example, in the X direction, the minimum dimension M1 of the opening 1002 may be 1.2-1.5 times the maximum dimension M2 of the first main body sub-portion 10011. For example, the minimum dimension M1 of the opening 1002 may be 1.2-1.4 times the maximum dimension M2 of the first main body sub-portion 10011. For example, the minimum dimension M1 of the opening 1002 may be 1.2-1.3 times the maximum dimension M2 of the first main body sub-portion 10011. For example, the minimum dimension M1 of the opening 1002 may be 1.2-1.25 times the maximum dimension M2 of the first main body sub-portion 10011. For example, the minimum dimension M1 of the opening 1002 may be 1.2-1.35 times the maximum dimension M2 of the first main body sub-portion 10011. For example, the minimum dimension M1 of the opening 1002 may be 1.2-1.45 times the maximum dimension M2 of the first main body sub-portion 10011. For example, the minimum dimension M1 of the opening 1002 may be 1.3-1.5 times the maximum dimension M2 of the first main body sub-portion 10011. For example, the minimum dimension M1 of the opening 1002 may be 1.4-1.5 times the maximum dimension M2 of the first main body sub-portion 10011.

For example, as illustrated in FIG. 3, in the arrangement direction of the adjacent sub-pixels (for example, the X direction), the maximum dimension M2 of the first main body sub-portion 10011 is 0.4-0.8 times the maximum dimension M3 of the second main body sub-portion 10012, within this value range, a protruding degree of the second main body sub-portion 10012 relative to the first main body sub-portion 10011 can be made more appropriate.

For example, as illustrated in FIG. 3, in the direction perpendicular to the base substrate 01 (for example, a Z direction), the maximum dimension N1 of the first main body sub-portion 10011 is 1-1.8 times the maximum dimension N2 of the second main body sub-portion 10012. For example, in the case where the maximum dimension N1 of the first main body sub-portion 10011 is larger than the maximum dimension N2 of the second main body sub-portion 10012, it may be facilitated to make at least one of the plurality of film layers in the light-emitting functional layer 130 be broken at the separation structure 10013 of the main body portion 1001.

For example, in the arrangement direction of adjacent sub-pixels, the maximum dimension M2 of the first main body sub-portion 10011 may be 0.4-0.7 times the maximum dimension M3 of the second main body sub-portion 10012. For example, the maximum dimension M2 of the first main body sub-portion 10011 may be 0.5-0.6 times the maximum dimension M3 of the second main body sub-portion 10012. For example, the maximum dimension M2 of the first main body sub-portion 10011 may be 0.4-0.6 times the maximum dimension M3 of the second main body sub-portion 10012. For example, the maximum dimension M2 of the first main body sub-portion 10011 may be 0.5-0.7 times the maximum dimension M3 of the second main body sub-portion 10012. For example, the maximum dimension M2 of the first main body sub-portion 10011 may be 0.5-0.8 times the maximum dimension M3 of the second main body sub-portion 10012. For example, the maximum dimension M2 of the first main body sub-portion 10011 may be 0.4-0.8 times the maximum dimension M3 of the second main body sub-portion 10012.

For example, in a direction perpendicular to the base substrate 01, the maximum dimension N1 of the first main body sub-portion 10011 may be 1-1.6 times the maximum dimension N2 of the second main body sub-portion 10012. For example, the maximum dimension N1 of the first main body sub-portion 10011 may be 1.2-1.6 times the maximum dimension N2 of the second main body sub-portion 10012. For example, the maximum dimension N1 of the first main body sub-portion 10011 may be 1.3-1.6 times the maximum dimension N2 of the second main body sub-portion 10012. For example, the maximum dimension N1 of the first main body sub-portion 10011 may be 1.2-1.4 times the maximum dimension N2 of the second main body sub-portion 10012. For example, the maximum dimension N1 of the first main body sub-portion 10011 may be 1.3-1.5 times the maximum dimension N2 of the second main body sub-portion 10012. For example, the maximum dimension N1 of the first main body sub-portion 10011 may be 1.1-1.4 times the maximum dimension N2 of the second main body sub-portion 10012. For example, the maximum dimension N1 of the first main body sub-portion 10011 may be 1.4-1.6 times the maximum dimension N2 of the second main body sub-portion 10012. For example, the maximum dimension N1 of the first main body sub-portion 10011 may be 1.4-1.5 times the maximum dimension N2 of the second main body sub-portion 10012.

For example, as illustrated in FIG. 3, the first electrode 120 includes a crystallized conductive metal oxide.

For example, processes such as heat treatment are included in a process of forming the main body portion 1001. During the heat treatment, the first electrode 120 may be crystallized to prevent from being affected during an etching process of the main body portion 1001. For example, a crystallized first electrode 120 can be less affected by wet etching solution when the main body portion 1001 is wet etched, so as to protect inherent characteristics of the first electrode 120 itself.

For example, as illustrated in FIG. 3, an orthographic projection of a part of the light-emitting functional layer 130 on a side of the second main body sub-portion 10012 away from the base substrate 01 on the base substrate 01, at least partially overlaps with an orthographic projection of a part of the light-emitting functional layer 130 located in the opening 1002 on the base substrate.

For example, as illustrated in FIG. 3, the light-emitting functional layer 130 includes a plurality of film layers, and the plurality of film layers are broken at the separation structure 10013, so that the plurality of film layers include a portion arranged on the side of the second main body sub-portion 10012 away from the base substrate 01, and a portion located in the opening 1002. For example, a part of the light-emitting functional layer 130 located in the opening 1002 can extend into the groove 10014 on both sides of the opening 1002 according to a broken position and a broken condition. Therefore, the orthographic projection of a part of the light-emitting functional layer 130 on the side of the second main body sub-portion 10012 away from the base substrate 01 on the base substrate 01, at least partially overlaps with the orthographic projection of a part of the light-emitting functional layer 130 located in the opening 1002 on the base substrate.

For example, as illustrated in FIG. 3, an orthographic projection of a part of the second electrode 140 on a side of the second main body sub-portion 10012 away from the base substrate 01 on the base substrate 01, at least partially overlaps with an orthographic projection of a part of the second electrode 140 located in the opening 1002 on the base substrate 01.

For example, as illustrated in FIG. 3, the second electrode 140 is located on the side of the light-emitting element 130 away from the base substrate 01, and at least part of the second electrode 140 is broken at the separation structure 10013, so that the second electrode 140 includes the part located on the side of the second main body sub-portion 10012 away from the base substrate 01, and the part located in the opening 1002. For example, according to different broken positions, the part of the second electrode 140 located in the opening 1002 can extend into the groove 10014 on both sides of the opening 1002, so that an orthographic projection of the part of the second electrode 140 located in the opening on the base substrate 01, at least partially overlaps with the orthographic projection of the part of the light-emitting functional layer 130 located in the opening 1002 on the base substrate 01.

Figure 4:
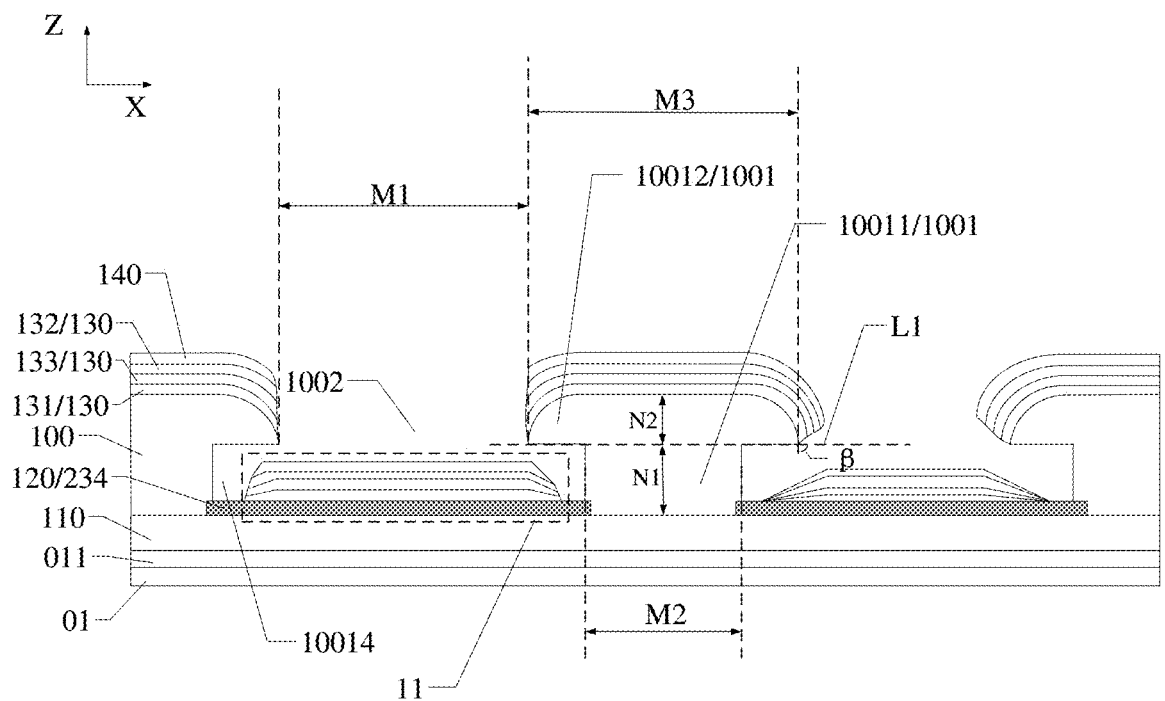
FIG. 4 is a cross-sectional view of another display substrate provided by at least one embodiment of the present disclosure.

FIG. 4 is a cross-sectional view of another display substrate provided by at least one embodiment of the present disclosure.

For example, compared with the display substrate illustrated in FIG. 3, in the display substrate illustrated in FIG. 4, the sum of the minimum thickness of a part of the light-emitting functional layer 130 and a part of the second electrode 140 of the light-emitting element 11 that are located in the groove 10014 increases, and the minimum dimension between two adjacent main body portions 1001 increases (for example, approximately equal to M1), and therefore, the area of the light-emitting region of the light-emitting element 234 exposed by the opening 1002 is increased, thereby improving the display effect.

For example, the sum of the minimum thickness of a part of the light-emitting functional layer 130 and a part of the second electrode 140 of the light-emitting element 11 that extend into the groove 10014 may be ⅓-1 of the sum of the maximum thickness of the light-emitting functional layer 130 and the maximum thickness of the second electrode 140. For example, the sum of the minimum thickness of a part of the light-emitting functional layer 130 and a part of the second electrode 140 of the light-emitting element 11 that extend into the groove 10014 may be ½-1 of the sum of the maximum thickness of the light-emitting functional layer 130 and the maximum thickness of the second electrode 140. The sum of the minimum thickness of a part of the light-emitting functional layer 130 and a part of the second electrode 140 of the light-emitting element 11 that extend into the groove 10014 may be ¼-½ of the sum of the maximum thickness of the light-emitting functional layer 130 and the maximum thickness of the second electrode 140. The sum of the minimum thickness of a part of the light-emitting functional layer 130 and a part of the second electrode 140 of the light-emitting element 11 that extend into the groove 10014 may be ⅓-½ of the sum of the maximum thickness of the light-emitting functional layer 130 and the maximum thickness of the second electrode 140.

For example, in the X direction, the maximum dimension of the light-emitting region exposed by the opening 1002 may be 75%-100% of the minimum dimension M1 of the opening 1002. For example, in the X direction, the maximum dimension of the light-emitting region exposed by the opening 1002 may be 75%-95% of the minimum dimension M1 of the opening 1002. For example, in the X direction, the maximum dimension of the light-emitting region exposed by the opening 1002 may be 80%-100% of the minimum dimension M1 of the opening 1002. For example, in the X direction, the maximum dimension of the light-emitting region exposed by the opening 1002 may be 85%-95% of the minimum dimension M1 of the opening 1002. For example, in the X direction, the maximum dimension of the light-emitting region exposed by the opening 1002 may be 70%-90% of the minimum dimension M1 of the opening 1002. With such arrangement, the area of the light-emitting region exposed by the opening 1002 can be increased as much as possible, so as to improve the display effect of the display substrate.

Figure 5:
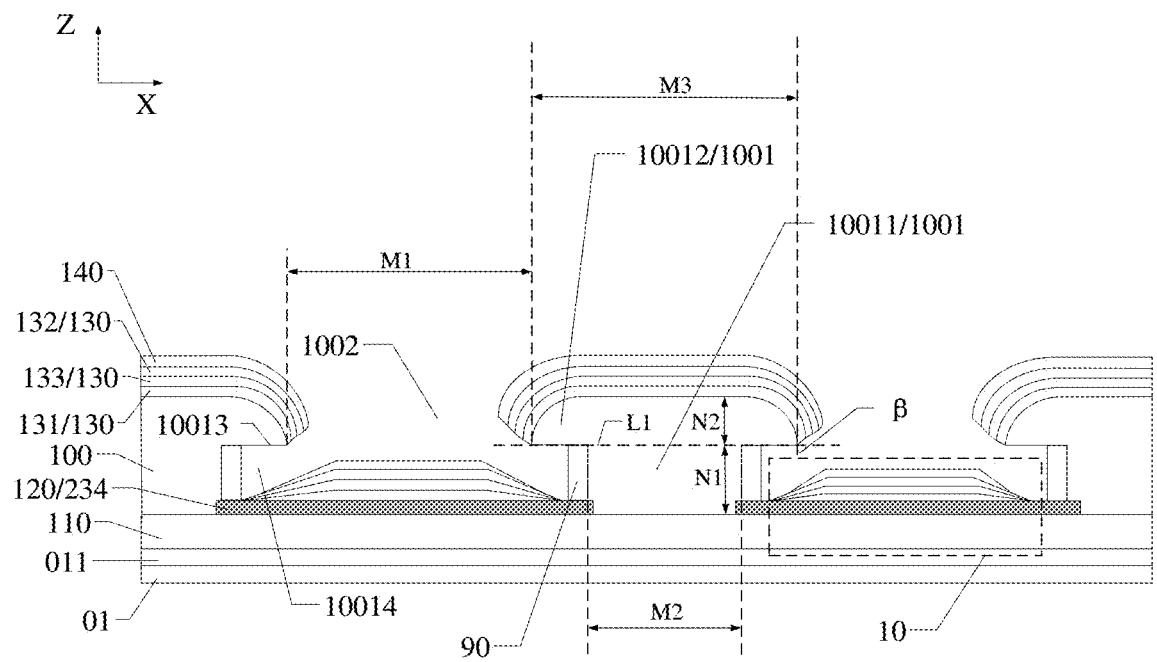
FIG. 5 is a cross-sectional view of another display substrate provided by at least one embodiment of the present disclosure.

FIG. 5 is a cross-sectional view of another display substrate provided by at least one embodiment of the present disclosure.

For example, as illustrated in FIG. 5, compared with the display substrate illustrated in FIG. 3, difference in the display substrate illustrated in FIG. 5 is that the separation structure 10013 includes a groove 10014, and the light-emitting functional layer 130 extends into the groove 10014, the display substrate 01 further includes a residual portion 90, the residual portion 90 is located in the groove 10014, and an orthographic projection of the residual portion 90 on the base substrate 01 falls within an orthographic projection of the separation structure 10013 on the base substrate 01.

For example, as illustrated in FIG. 5, the residual portion 90 may be a film layer structure left during a process of forming the main body portion 1001. For example, when forming the main body portion 1001, it is necessary to provide an additional film layer as a sacrificial structure, and remove the sacrificial structure to form the first main body sub-portion 10011 and the second main body sub-portion 10012. During this process, in the case where the sacrificial structure is not completely removed, a residual portion 90 as illustrated in FIG. 5 may be formed. As illustrated in FIG. 5, a dimension of the residual portion 90 in the Z direction is smaller than a dimension of the first main body sub-portion 10011 in the Z direction, and a dimension of the residual portion 90 in the X direction is smaller than a dimension of the groove 10014 in the X direction, so that an orthographic projection of the residual portion 90 on the base substrate 01 can fall within the orthographic projection of the separation structure 10013 on the base substrate 01. For example, the dimension of the residual portion 90 in the X direction can be determined according to factors such as removal time and removal degree of the sacrificial structure, and FIG. 5 is only for illustration, but not limited thereto.

For example, as illustrated in FIG. 5, for any sub-pixel, the maximum dimension of the residual portion 90 in the X direction is not greater than the maximum dimension of the groove 10014 in the X direction, and the orthographic projection of the residual portion 90 on the base substrate 01 falls within the orthographic projection of the groove 10014 of the separation structure 10013 on the base substrate 01, so as not to affect the light-emitting performance of the light-emitting element 234. For example, the maximum dimension of the residual portion 90 in the Z direction may be the same as or different from that of the groove 10014 in the Z direction. For example, shapes of the residual portions 90 located in the groove 10014 of different sub-pixels may be different, which depends on the removal time and removal degree of the sacrificial structure, which is not limited by the embodiments of the present disclosure. For example, the maximum dimension of the residual portion 90 in the X direction is ⅙-1 of the maximum dimension of the groove 10014 in the X direction. For example, the maximum dimension of the residual portion 90 in the X direction is ¼-⅓ of the maximum dimension of the groove 10014 in the X direction. For example, the maximum dimension of the residual portion 90 in the X direction is ¼-⅔ of the maximum dimension of the groove 10014 in the X direction. For example, the maximum dimension of the residual portion 90 in the X direction is ⅓-½ of the maximum dimension of the groove 10014 in the X direction. For example, the maximum dimension of the residual portion 90 in the X direction is ⅓-⅔ of the maximum dimension of the groove 10014 in the X direction.

For example, when forming the separation structures 10013 of the plurality of sub-pixels, thicknesses of the sacrificial structure can be arranged to be uniform, and the removal time and the removal degree of the sacrificial structure can also be arranged to be the same, respectively, so as to simplify a process flow and improve uniformity of the sub-pixel structure. Of course, in actual operation process, it can also be flexibly designed according to actual process conditions. For example, the sacrificial structures in some sub-pixels may be completely removed, and the sacrificial structures in some sub-pixels may not be completely removed, which is not limited in the embodiments of the present disclosure.

For example, referring to FIG. 5, in the case where a part of the light-emitting functional layer 130 is located in the groove 10014 of the separation structure 10013, the part of the light-emitting functional layer 130 may at least partially overlap with the residual portion 90 in the groove 10014. In this case, the second electrode 140 is arranged on the side of the light-emitting functional layer 130 away from the first electrode 120, and is arranged spaced apart from the first electrode 120 through the light-emitting functional layer 130, and the second electrode 140 does not overlap with the residual portion, so as to reduce a risk of circuit failure.

For example, when forming the main body portion 1001, part of developer solution may not be completely used or removed during processes such a development process and so on, and may partially remain, for example, in the groove 10014 of the main body portion 1001.

Therefore, the main body portion 1001 formed with an undercut structure further has an effect of improving structures such as residual film.

Figure 6:
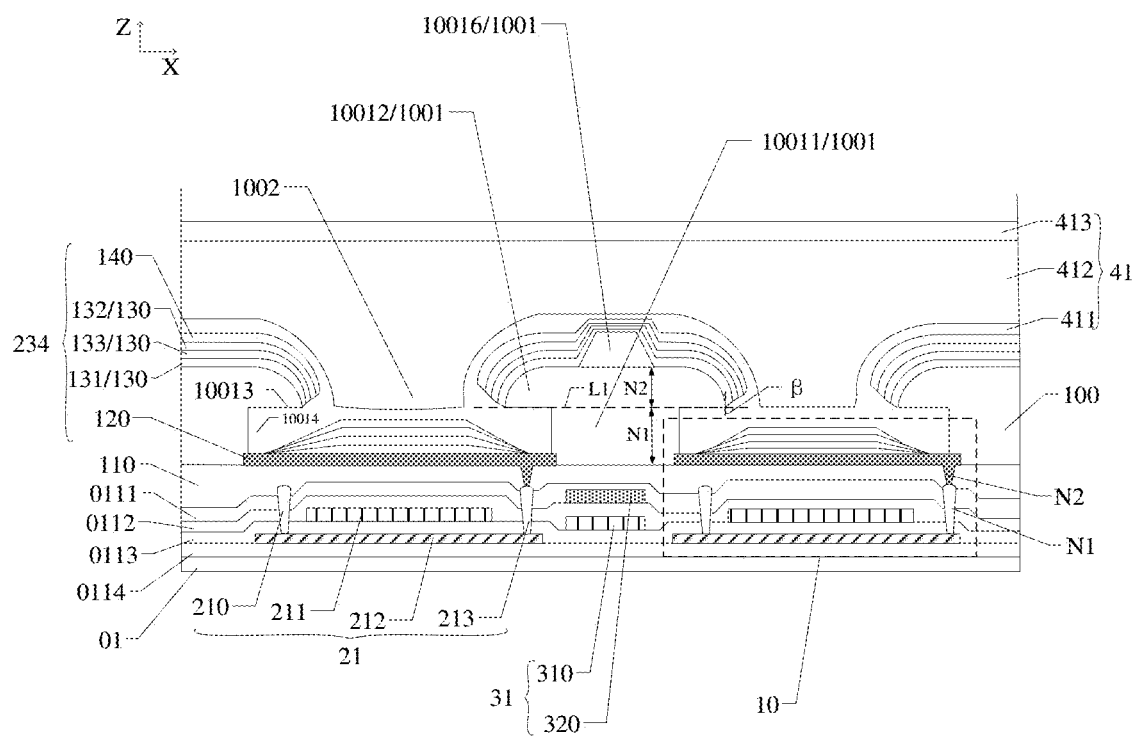
FIG. 6 is a cross-sectional view of another display substrate provided by at least one embodiment of the present disclosure.

FIG. 6 is a cross-sectional view of another display substrate provided by at least one embodiment of the present disclosure.

For example, as illustrated in FIG. 6, structure of the planarization layer 110 and a structure located on a side of the planarization layer 110 away from the base substrate 01 may be basically the same as that of the display substrate in FIG. 3, related descriptions can refer to description of above mentioned embodiments, and unnecessary details will not be given here.

For example, as illustrated in FIG. 6, in the direction perpendicular to the base substrate 01, that is, in the Z direction, the display substrate includes a buffer layer 0114, an insulating layer 0113, an insulating layer 0112, an insulating layer 0111, and a planarization layer 110 that are sequentially arranged. For example, the insulating layer 0113, the insulating layer 0112, and the insulating layer 0111 can be made of an inorganic material, for example, silicon nitride (SiNx) or silicon oxide (SiOx) can be adopted. For example, the buffer layer 0114 can be used to improve water and oxygen resistance ability of the base substrate 01.

For example, as illustrated in FIG. 6, the display substrate further includes a pixel circuit configured to drive the light-emitting element to emit light. For example, the pixel circuit can adopt a design of 2T1C, 3T1C or 7T1C. For example, the pixel circuit may include a plurality of transistors and a storage capacitor, for example, the plurality of transistors may include a thin film transistor 21, the thin film transistor 21 includes a gate electrode 211, an active layer 212, a source electrode 210, a drain electrode 213, and the first electrode 120 is connected with the drain electrode 213. The source electrode 210 and the drain electrode 213 of the thin film transistor may be identical in structure, and may be interchangeable in terms of names.

For example, as illustrated in FIG. 6, the pixel circuit may include a capacitor 31, and the capacitor 31 includes a first electrode plate 310 and a second electrode plate 320 that are arranged opposite to each other.

For example, as illustrated in FIG. 6, the display substrate further includes a support structure 10016 arranged on the side of the main body portion 1001 away from the base substrate, which is configured as a support layer, and is configured to support a FMM (high precision mask plate) during the evaporation process of the display substrate. For example, the support structure 10016 can adopt the same material as the main body portion 1001. For example, the support structure 10016 may be integrally formed with the main body portion 1001.

For example, FIG. 6 further illustrates an encapsulation layer 41. For example, the encapsulation layer 41 includes a first encapsulation layer 411, a second encapsulation layer 412, and a third encapsulation layer 413. For example, the first encapsulation layer 411 and the third encapsulation layer 413 are inorganic layers, which can be formed by adopting a chemical vapor deposition (CVD) process. The second encapsulation layer 412 is an organic layer, which can be formed by adopting an inkjet printing process. As illustrated in FIG. 6, a thickness of the second encapsulation layer 412 is greater than a thickness of the first encapsulation layer 411. As illustrated in FIG. 6, the thickness of the second encapsulation layer 412 is greater than a thickness of the third encapsulation layer 413, so as to achieve a better encapsulation effect.

Figure 7:
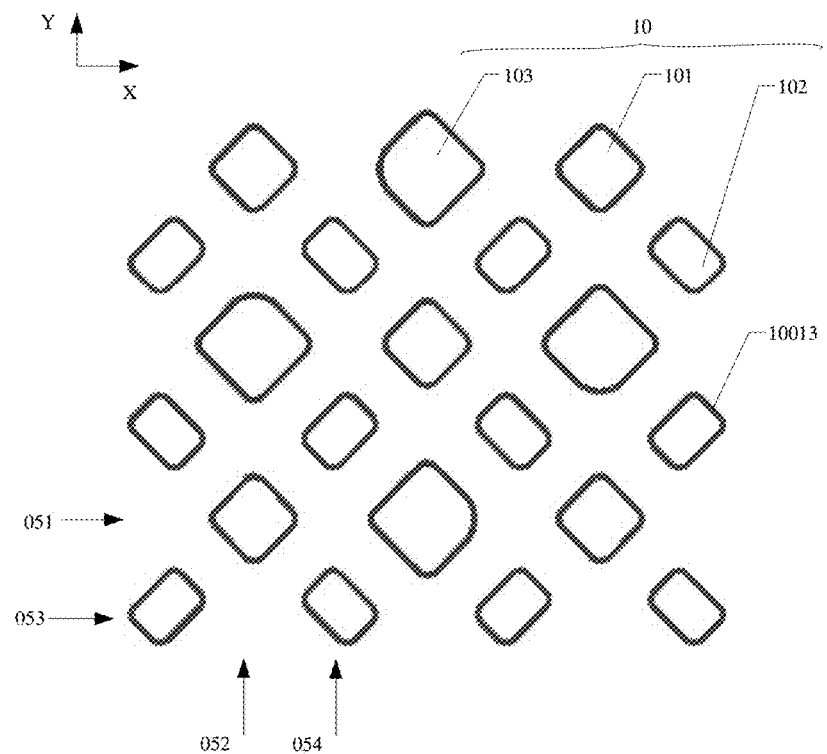
FIG. 7 is a schematic plan view of a structure of a display substrate provided by at least one embodiment of the present disclosure.
Figure 8:
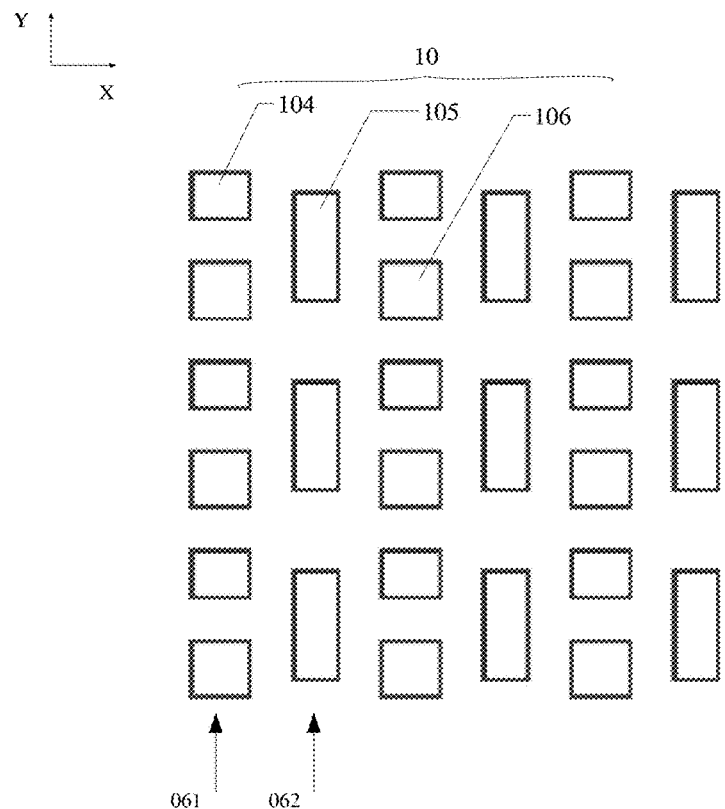
FIG. 8 is a schematic plan view of a structure of another display substrate provided by at least one embodiment of the present disclosure.
Figure 9:
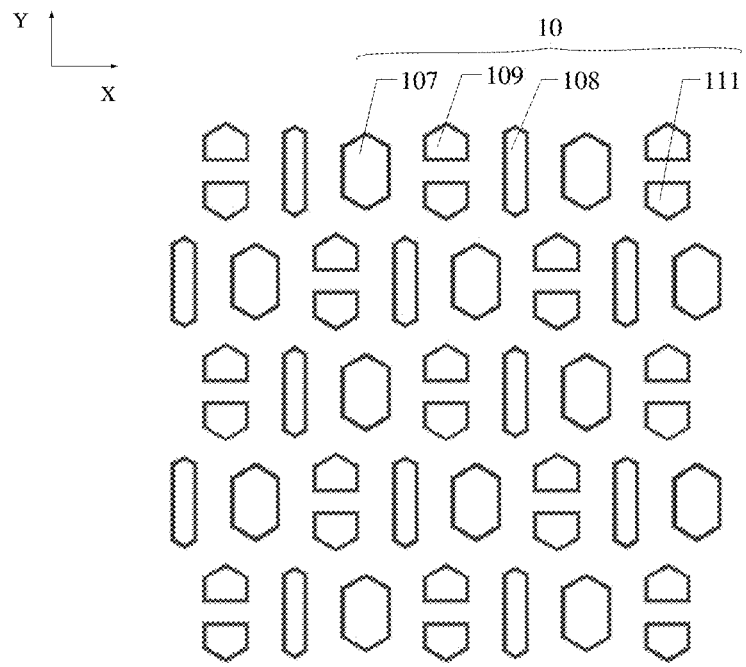
FIG. 9 is a schematic plan view of a structure of another display substrate provided by at least one embodiment of the present disclosure.

FIG. 7 is a schematic plan view of a structure of a display substrate provided by at least one embodiment of the present disclosure. FIG. 8 is a schematic plan view of a structure of another display substrate provided by at least one embodiment of the present disclosure. FIG. 9 is a schematic plan view of a structure of another display substrate provided by at least one embodiment of the present disclosure.

For example, as illustrated in FIG. 7, the plurality of sub-pixels 10 include a plurality of first color sub-pixels 101, a plurality of second color sub-pixels 102, and a plurality of third color sub-pixels 103. For example, one of the first color sub-pixel 101 and the third color sub-pixel 103 emits red light, and the other one of the first color sub-pixel 101 and the third color sub-pixel 103 emits blue light; the second color sub-pixel 102 emits green light. FIG. 7 schematically illustrates that the first color sub-pixel 101 emits red light and is a red sub-pixel; the third color sub-pixel 103 emits blue light and is a blue sub-pixel; the second color sub-pixel 102 emits green light and is a green sub-pixel.

For example, as illustrated in FIG. 7, a plurality of first color sub-pixels 101 and a plurality of third color sub-pixels 103 are alternately arranged in an X direction and a Y direction that are parallel to the base substrate 01 to form a plurality of first pixel rows 051 and a plurality of first pixel columns 052, a plurality of second color sub-pixels 101 are arranged in an array in the X direction and the Y direction to form a plurality of second pixel rows 053 and a plurality of second pixel columns 054, and the plurality of first pixels rows 051 and the plurality of second pixel rows 053 are alternately arranged in the Y direction and staggered from each other in the X direction, and the plurality of first pixel columns 052 and the plurality of second pixel columns 054 are alternately arranged in the X direction and staggered from each other in the Y direction. For example, an arrangement of the plurality of sub-pixels illustrated in FIG. 7 may be a Magic arrangement.

For example, the separation structure provided by at least one embodiment of the present disclosure may be applicable to different pixel arrangement structures. The arrangement manner of the sub-pixels and the shape of the light-emitting region illustrated in FIG. 8 and FIG. 9 are different from that of the sub-pixels illustrated in FIG. 7.

For example, as illustrated in FIG. 8, the plurality of sub-pixels 10 includes a plurality of third color sub-pixels 104, a plurality of fourth color sub-pixels 105, and a plurality of fifth color sub-pixels 106. FIG. 8 schematically illustrates that the third color sub-pixel 104 emits red light and is a red sub-pixel; the fourth color sub-pixel 105 emits blue light and is a blue sub-pixel; the fifth color sub-pixel 106 emits green light and is a green sub-pixel. A plurality of third color sub-pixels 104 and a plurality of fifth color sub-pixels 106 are arranged alternately in the Y direction parallel to the base substrate 01 to form a plurality of third pixel columns 061, and a plurality of fourth color sub-pixels 105 are evenly arranged between adjacent third pixel rows 061 to from a plurality of fourth pixel columns 062. Shapes of the light-emitting regions of the third color sub-pixel 104, the fourth color sub-pixel 105, and the fifth color sub-pixel 106 are all rectangular, and the shape of the light-emitting region of the fourth color sub-pixel 105 is approximately square. For example, an arrangement manner of the plurality of sub-pixels illustrated in FIG. 8 may be a SRGB arrangement.

For example, as illustrated in FIG. 9, the plurality of sub-pixels 10 includes a plurality of sixth color sub-pixels 107, a plurality of seventh color sub-pixels 108, a plurality of eighth color sub-pixels 109, and ninth color sub-pixels 111. FIG. 8 schematically illustrates that the sixth color sub-pixel 107 is a sub-pixel that emits red light, and is a red sub-pixel; the seventh color sub-pixel 108 is a sub-pixel that emits blue light, and is a blue sub-pixel; and the light-emitting color of the eighth color sub-pixel 109 and the ninth color sub-pixel 111 is the same, and both are sub-pixels that emit green light, which are green sub-pixels. A plurality of sub-pixels are arranged alternately in the X direction and the Y direction that are parallel to the base substrate. The eighth color sub-pixel 109 and the ninth color sub-pixel 111 can be arranged oppositely, and have equal areas of the light-emitting regions. Among the plurality of sub-pixels, the area of the light-emitting region of the sixth color sub-pixel 107 is the largest. For example, an arrangement of the plurality of sub-pixels illustrated in FIG. 9 may be a GGRB arrangement.

For example, in the display substrates illustrated in FIG. 7-FIG. 9, each sub-pixel can be surrounded by a ring-shaped separation structure 10013, and the separation structure 10013 can be arranged in a form without a notch. In this case, at least one film layer of the light-emitting layer between two adjacent sub-pixels is broken at the separation structure, so as to reduce a risk of crosstalk. For example, in order to ensure continuity of the second electrode, the second electrodes of different sub-pixels may be connected through a conductive light coupling layer CPL to form a common electrode structure. For example, in some embodiments of the present disclosure, the separation structure 10013 surrounding each sub-pixel may further be configured to include at least one notch, so as to prevent the second electrode from being broken between adjacent sub-pixels.

Figure 10A:
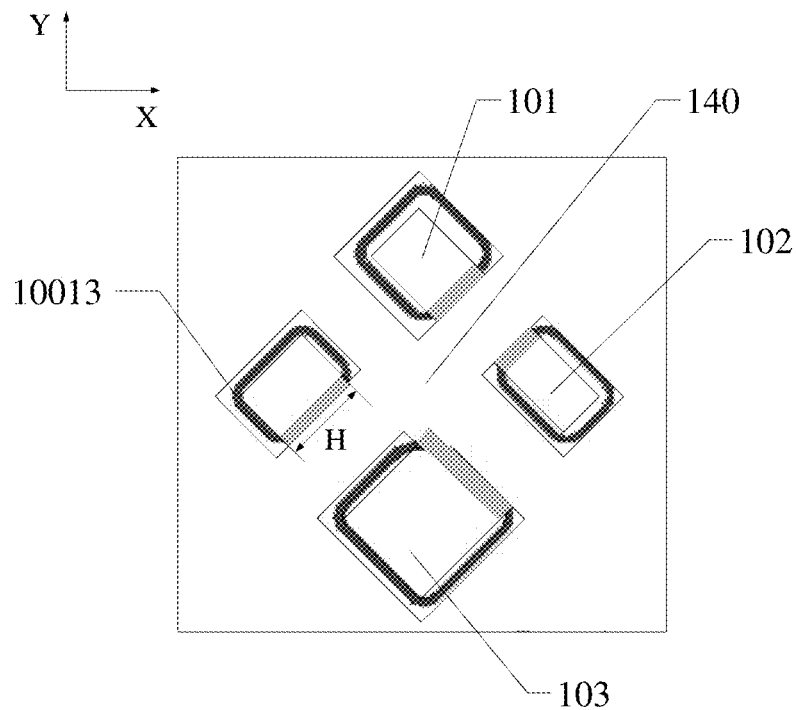
FIG. 10A is a schematic diagram of a separation structure with a notch in the display substrate illustrated in FIG. 7.
Figure 10B:
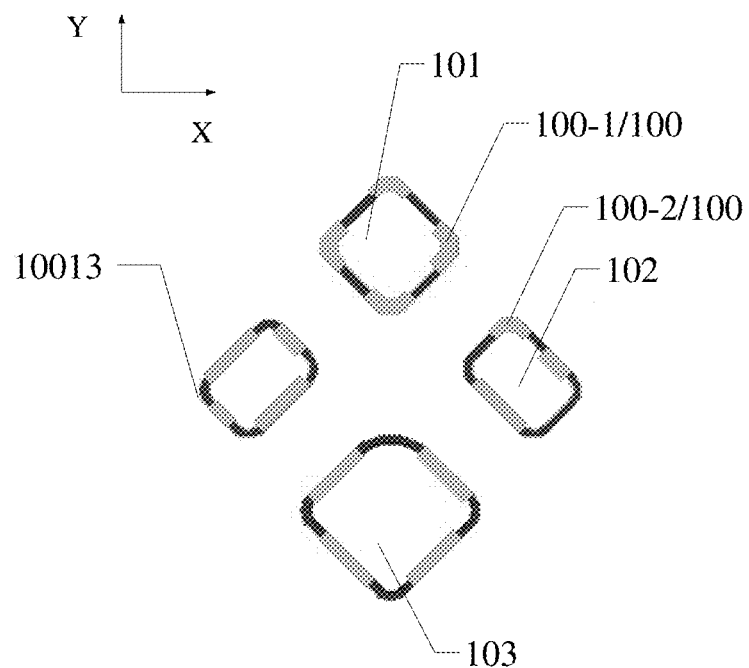
FIG. 10B is a schematic diagram of a separation structure with a notch in another display substrate illustrated in FIG. 7.
Figure 10C:
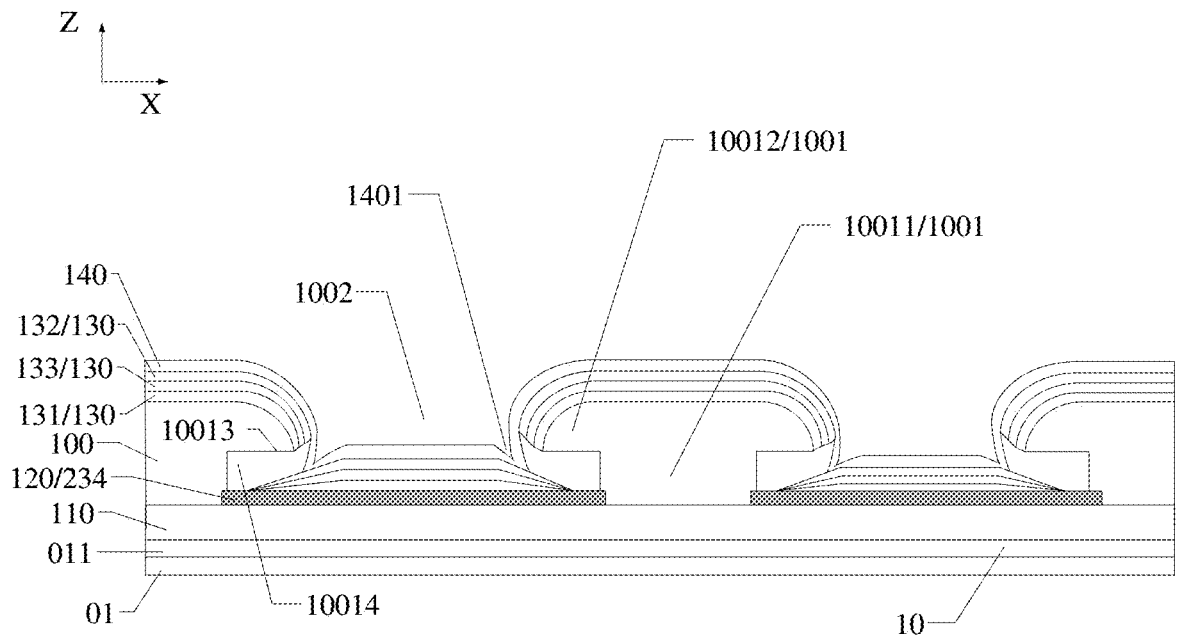
FIG. 10C is a schematic diagram of another display substrate provided by at least one embodiment of the present disclosure.

FIG. 10A is a schematic diagram of a separation structure with a notch in the display substrate illustrated in FIG. 7. FIG. 10B is a schematic diagram of a separation structure with a notch in another display substrate illustrated in FIG. 7. FIG. 10C is a schematic diagram of another display substrate provided by at least one embodiment of the present disclosure.

For example, in some embodiments of the present disclosure, arrangement situation of the separation structures 10013 of different sub-pixels may be different. For example, as illustrated in FIG. 10A-FIG. 10B, for the same opening 1002, the separation structure 10013 in the pixel defining layer 100 can be arranged in an unclosed ring-shape in a circumference direction of the opening 1002, and the second electrodes 140 of adjacent light-emitting elements 234 are at least partially connected at a notch of the unclosed ring-shape to ensure the continuity of the second electrodes 140 between adjacent sub-pixels. A length H of the notch of the unclosed ring-shape may be 5-20 microns.

Referring to FIG. 3 and FIG. 10A, the first color sub-pixel 101, the second color sub-pixel 102, and the third color sub-pixel 103 all include a separation structure 10013 arranged in an unclosed ring-shape, and the separation structure 10013 of each sub-pixel is arranged surrounding the light-emitting region of the sub-pixel, and the separation structure 10013 with the unclosed ring-shaped includes one notch. The second electrodes 140 of adjacent sub-pixel are broken at the separation structure 10013, and are connected at the notch of the separation structure 10013, so as to ensure connection continuity.

For example, in some embodiments of the present disclosure, the separation structure 10013 with the unclosed ring-shape may be C-shaped.

For example, referring to FIG. 3 and FIG. 10A, the length H of the notch of the separation structure 10013 with the unclosed ring-shape may be 15-20 microns. For example, the above mentioned dimension may be 10-20 microns. For example, the above mentioned dimension may be 8-15 microns. For example, the above mentioned dimension may be 5-15 microns. For example, the above mentioned dimension may be 10-15 microns. For example, the above mentioned dimension may be 12-25 microns. For example, the above mentioned dimension may be 16-24 microns. For example, the above mentioned dimension may be 14-18 microns. For example, the above mentioned dimension may be 18-22 microns, but is not limited thereto, and the embodiments of the present disclosure do not limited to this.

For example, referring to FIG. 3, FIG. 5, and FIG. 10A, in the case where the separation structure 10013 in the sub-pixel includes the residual portion 90, the residual portion 90 is located in the groove 10014 of the separation structure 10013, and for the light-emitting element 234 of the same sub-pixel, a pattern formed by the residual portion 90 can be an unclosed ring-shape. For example, shapes of the residual portion 90 at different positions in a circumferential direction of the same light-emitting element 234 may be different. For example, the residual portion 90 with the unclosed ring-shape may include a plurality of notches. For example, dimensions of the residual portions 90 with the unclosed ring-shape may be non-uniform, which is not limited in the embodiments of the present disclosure. For example, a length of the notch of the residue portion 90 with the unclosed ring-shape may be ¼-1 of the length of the notch of the separation structure 10013 with the unclosed ring-shape. For example, the above mentioned dimension may be ¼-⅓. For example, the above mentioned dimension may be ¼-½. For example, the above mentioned dimension may be ⅓-½. For example, the above mentioned dimension may be ⅓-⅔. For example, the above mentioned dimension may be ½-⅔. For example, the above mentioned dimension may be ⅔-¾.

For example, referring to FIG. 3 and FIG. 10B, for the same opening 1002, the separation structure 10013 in the pixel defining layer 100 may include a plurality of sub-portions, and the plurality of sub-portions are arranged in a ring-shape in a circumference direction of the opening 1002 to surround the light-emitting region of the light-emitting element 234. For example, the separation structure 10013 surrounding the opening 1002 may include at least one notch, that is, the separation structure 10013 does not form a complete circle around the light-emitting region of the sub-pixel. In this case, the second electrodes 140 in the light-emitting elements 234 of adjacent sub-pixels 10 may be connected to each other at the notch, so as to facilitate supplying the same signal. For example, as illustrated in FIG. 10B, for the sub-pixel 101 and sub-pixel 102 that are adjacent to each other, the second electrodes 140 of the two adjacent sub-pixels can be connected through a region where the separation structure 10013 is not formed, for example, through a first region 100-1 and a second region 100-2 to realize a connection of the second electrodes 140, but is not limited thereto. For example, the second electrode 140 of the sub-pixel 101 may realize a connection with the second electrode 140 of the sub-pixel 102 at any part of the pixel defining layer 100 in the sub-pixel 101 where the separation structure 10013 is not formed and at any part of the pixel defining layer 100 in the sub-pixel 102 where the separation structure 10013 is not formed.

For example, in some embodiments of the present disclosure, in order to reduce a risk of disconnection of the second electrode 140. At the separation structure, an auxiliary connection electrode can further be added in a form of a secondary mask to connect the second electrodes 140 of different sub-pixels, or other film layers in the light-emitting element 234 can be made conductive, for example, a light coupling layer CPL in the light-emitting element can be made conductive. That is, the second electrodes 140 of different sub-pixels may be connected through the conductive light coupling layer CPL, but is not limited thereto.

For example, referring to FIG. 3, FIG. 10A and FIG. 10B, for the same sub-pixel, at least part of a boundary of the separation structure 10013 is substantially the same as a boundary profile of the light-emitting region of the sub-pixel that is immediately adjacent to the separation structure. For example, the boundary profile of the light-emitting region of a sub-pixel may include a plurality of straight edges, and/or arc-shaped edges connecting adjacent straight lines, and a boundary profile of the separation structure 10013 surrounding the light-emitting region may include a straight edge profile corresponding to the straight edge of the light-emitting region, and/or an arc-shaped edge profile corresponding to the arc-shaped edge. For example, referring to FIG. 3 and FIG. 10, for the same sub-pixel, in the case where the main body portion 1001 is arranged, because the second main body sub-portion 10012 protrudes in the X direction relative to the first main body sub-portion 10011 to form a groove 10014, therefore, for two adjacent sub-pixels, in the case where the pixel defining layer 100 between the two adjacent sub-pixels is arranged in a form of the separation structure 10013, in the X direction, the minimum distance between an orthographic projection of the separation structure 10013 and an orthographic projection of a center of the light-emitting region of each sub-pixel on the base substrate will increase, that is, the orthographic projection of the separation structure 10013 on the base substrate will be farther away from the orthographic projection of the center of the light-emitting region of each sub-pixel on the base substrate. Therefore, for two adjacent sub-pixels, an area of an orthographic projection of the pixel defining layer in the form of the separation structure 10013 on the base substrate is smaller than an area of an orthographic projection of the pixel defining layer not in the form of the separation structure 10013 on the base substrate. Therefore, the embodiments of the present disclosure can reduce crosstalk between adjacent sub-pixels by arranging the separation structure, and at the same time, increase the area of the light-emitting region of the light-emitting element, so as to improve the display effect.

For example, referring to FIG. 3, FIG. 10A and FIG. 10B, according to different light-emitting colors, for example, the sub-pixel 101 may be a first color sub-pixel 101, and the sub-pixel 102 may be a second color sub-pixel 102. The plurality of sub-pixels 10 further include a sub-pixel 103, and a light-emitting color of the sub-pixel 103 is different from that of the sub-pixel 101 and is different from that of the sub-pixel 102, and the sub-pixel 103 is a third color sub-pixel 103. For example, the separation structure 10013 can be located between the first color sub-pixel 101 and the third color sub-pixel 103 that are adjacent to each other, and/or the separation structure 10013 can be located between the second color sub-pixel 102 and the third color sub-pixel 103 that are adjacent to each other, and/or, the separation structure 10013 may be located between the first color sub-pixels 101 and the second color sub-pixel 102 that are adjacent to each other.

For example, referring to FIG. 3, FIG. 10A and FIG. 10B, a number of the separation structures 10013 surrounding the light-emitting region of one sub-pixel may be four. For example, the four separation structures 10013 may be respectively located at four corner portions of the light-emitting region. For example, the four separation structures 10013 may be parallel to four edges of the light-emitting region, respectively. For example, the number of the separation structures 10013 surrounding one sub-pixel may be three. For example, the separation structure 10013 of the same sub-pixel may be located at the corner portion of the light-emitting region, or at an edge portion parallel to the light-emitting region. An arrangement position and a quantity of the separation structures 10013 can be determined according to design requirements of an actual layout, which are not limited in the embodiments of the present disclosure.

For example, as illustrated in FIG. 10C, compared with the display substrate illustrated in FIG. 3, the display substrate illustrated in FIG. 10C is different in that the second electrode 140 is not broken at the separation structure 10013.

For example, compared with the display substrate illustrated in FIG. 3, the maximum dimension of the groove 10014 of the main body portion 1001 in the display substrate illustrated in FIG. 10C in the Z direction can be relatively reduced, but is not limited thereto.

As illustrated in FIG. 10C, the light-emitting functional layer 130 is broken at the separation structure 10013, the second electrode 140 is arranged on the side of the light-emitting functional layer 130 away from the base substrate 01, and the second electrode 140 is continuously arranged at the separation structure 10013. A part of the second electrode 140 located on the side of the main body portion 1001 away from the base substrate 01 is integrally connected with a part of the second electrode 140 located in the opening 1002 to form bent regions 1401 located on both sides of the opening 1002. For example, in the same opening 1002, a thickness of a part of the second electrode 140 located in the bent region 1401 is smaller than a thickness of a part of the second electrode 140 at a middle part of the opening 1002.

For example, the thickness of the part of the second electrode 140 located in the bent region 1401 is smaller than a thickness of a part of the second electrode 140 located at the side of the main body portion 1001 away from the base substrate 01, but is not limited thereto. For example, the thickness of the part of the second electrode 140 located in the bent region 1401 is 1/4-3/4 of the thickness of the part of the second electrode 140 located at the side of the main body portion 1001 away from the base substrate 01. For example, the above dimension may be 1/3-3/4. For example, the above dimension may be 1/2-3/4. For example, the above dimension may be 1/4-2/3. For example, the above dimension may be 1/3-2/3.

Therefore, in the display substrate illustrated in FIG. 10C, an arrangement of the separation structure 10013 can only disconnect at least one film layer in the light-emitting functional layer 130, and not affect the continuity of the second electrode 140, which can better ensure that the second electrodes 140 between adjacent sub-pixels are normally connected.

It should be noted that a continuous state of the second electrode 140 illustrated in FIG. 10C is only schematic. In some embodiments of the present disclosure, according to different process conditions and design requirements, the shape of the second electrode 140 (for example, thickness) can be changed accordingly, which is not limited.

Figure 11:
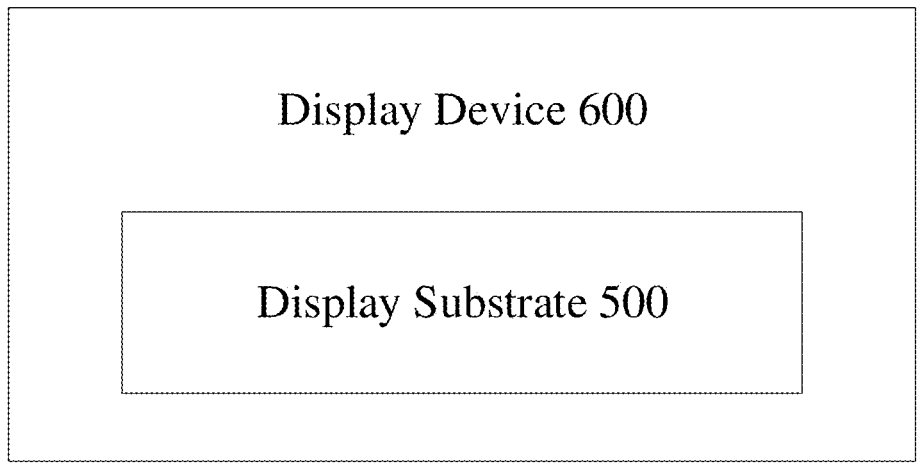
FIG. 11 is a schematic diagram of a display device provided by an embodiment of the present disclosure.
Figure 12:
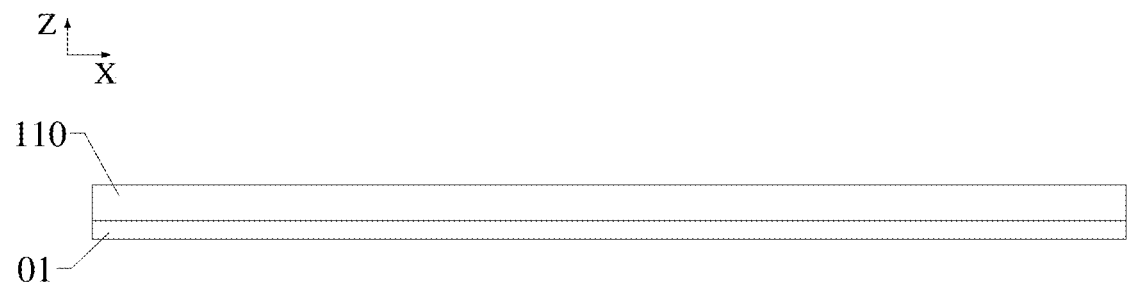
FIG. 12 to FIG. 20 are schematic flowcharts of a manufacturing method of a display substrate illustrated in at least one embodiment of the present disclosure.
Figure 13:
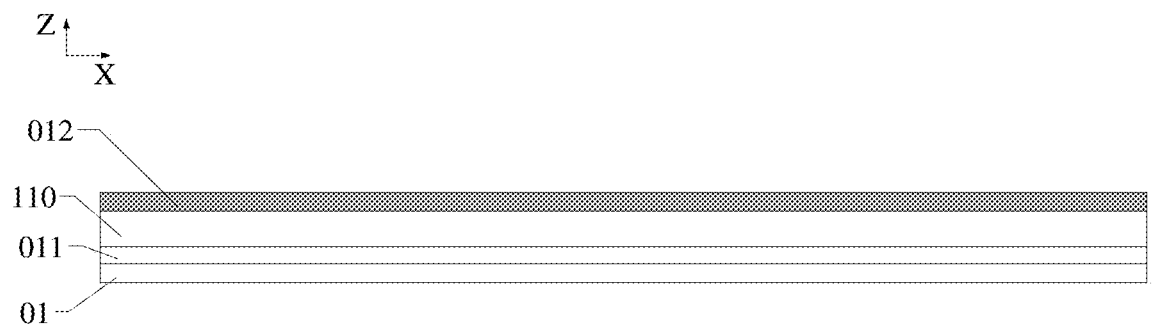
Figure 14:
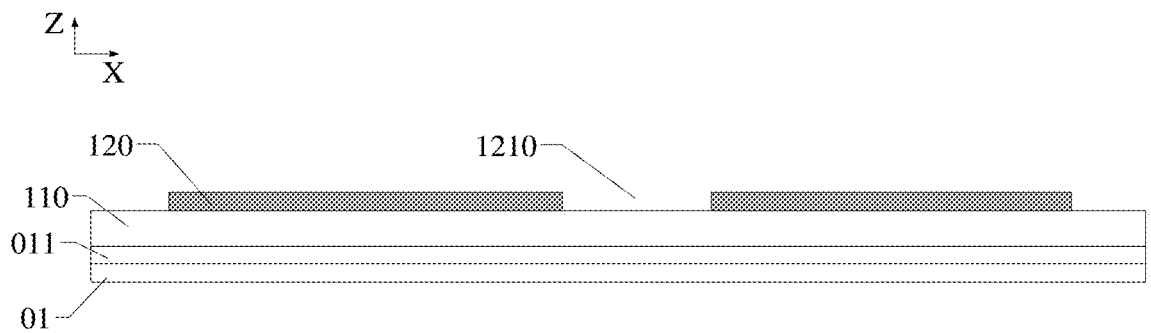
Figure 15:
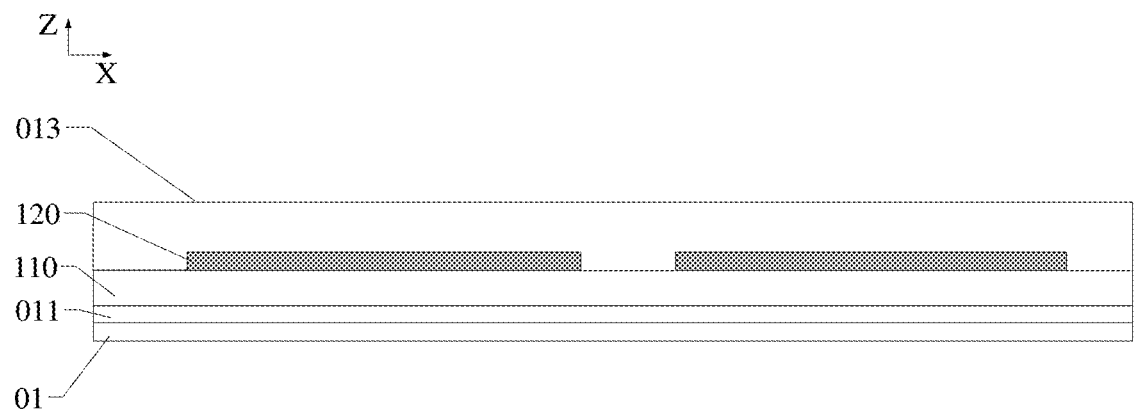
Figure 16:
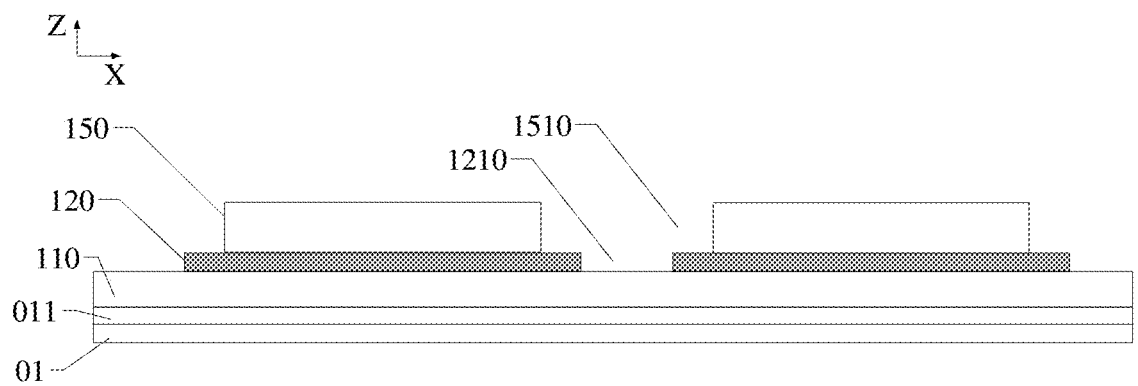
Figure 17:
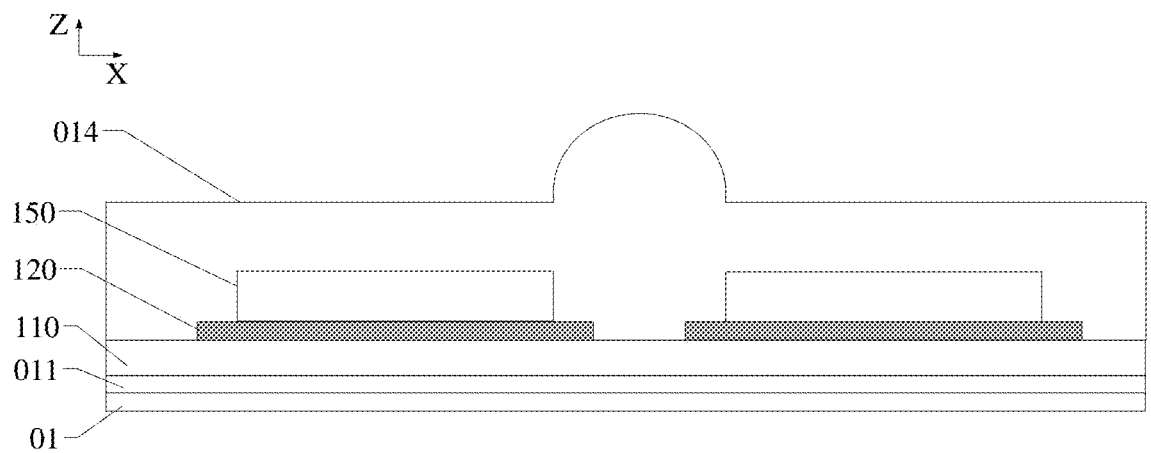
Figure 18:
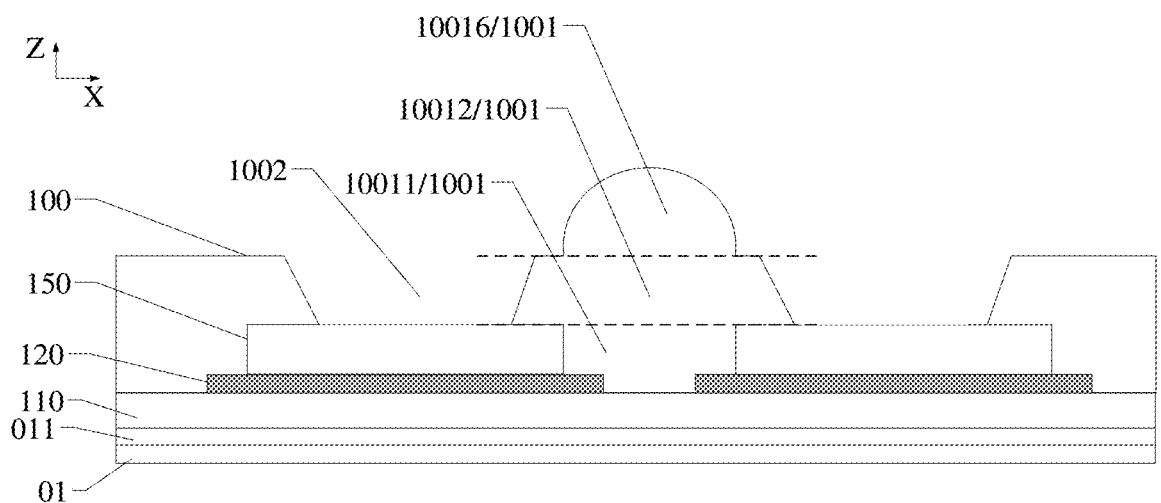
Figure 19:
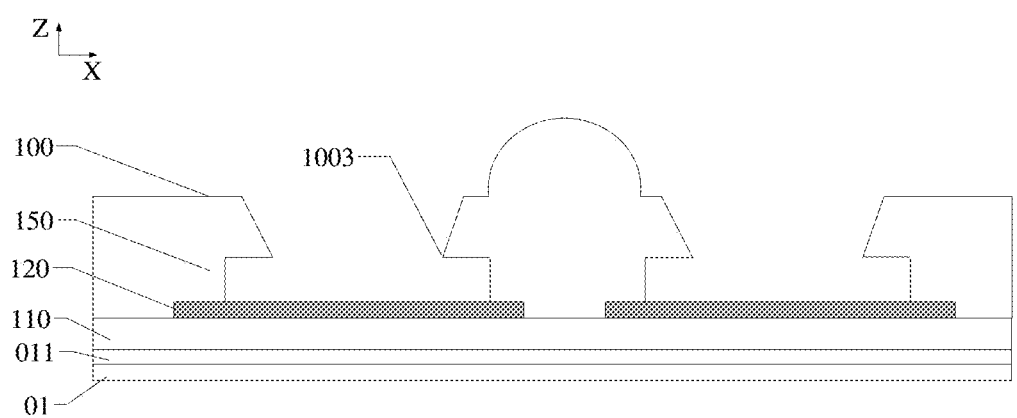
Figure 20:
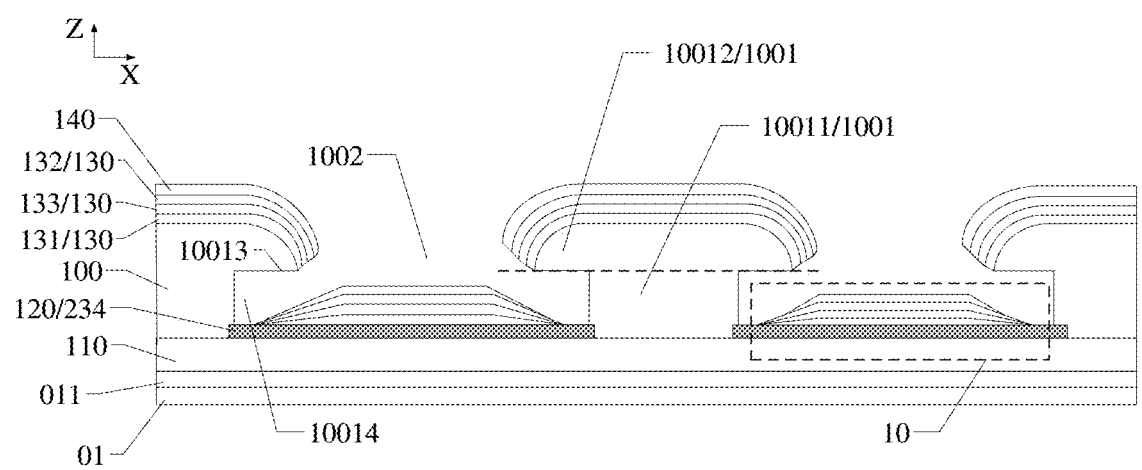

FIG. 11 is a schematic diagram of a display device provided by an embodiment of the present disclosure.

An embodiment of the present disclosure further provides a display device, including any one of the above mentioned display substrates.

As illustrated in FIG. 11, a display device 600 includes a display substrate 500. The display substrate 500 is any one of the above mentioned display substrates. The display substrate mentioned in the embodiments of the present disclosure may further be referred to as a display panel. For example, the display substrate may be a flexible display substrate, but not limited thereto.

On one hand, the display substrate (display panel) is provided with a separation structure between adjacent sub-pixels, and at least one film layer in the light-emitting functional layer, for example, the charge-generating layer, is broken at a position of the separation structure, thereby avoiding the crosstalk between adjacent sub-pixels caused by a film layer with high conductivity (for example, the charge-generating layer). Therefore, the display device including the display substrate can also avoid the crosstalk between adjacent sub-pixels, thereby having a higher product yield and higher display quality. At the same time, by arranging the separation structure in the display substrate (display panel), an area of the light-emitting region of the light-emitting element can further be increased to improve the display effect.

On the other hand, because the display substrate can adopt a tandem structure to increase pixel density, the display device including the display substrate has advantages of long life, low power consumption, high brightness, high resolution, and so on.

For example, the display device can be a display device such as an organic light-emitting diode display device, and any product or component including the display device with display function such as a TV, a digital camera, a mobile phone, a watch, a tablet computer, a notebook computer, a navigator, and so on, the embodiments of the present disclosure include but is not limited thereto.

FIG. 12 to FIG. 20 are schematic flowcharts of a manufacturing method of a display substrate illustrated in at least one embodiment of the present disclosure.

As illustrated in FIG. 12 to FIG. 20, at least one embodiment of the present disclosure further provides a method for manufacturing a display substrate, including: forming a planarization layer 110 on the base substrate 01; forming a first conductive film 012 on the planarization layer 110, and patterning the first conductive film 012 to form a first electrode 120; forming a second conductive film 013 on the first electrode 120, and patterning the second conductive film 013 to form a sacrificial structure 150; forming a pixel defining film 014 on the sacrificial structure 150, and patterning the pixel defining film 014 to form a pixel defining layer 100, the pixel defining layer 100 including a main body portion 1001 and a plurality of openings 1002 each exposing at least a part of the first electrode 120; removing the sacrificial structure 150 so that the main body portion 1001 includes a first main body sub-portion 10011 and a second main body sub-portion 10012, the first main body sub-portion 10011 being located on a side of the second main body sub-portion 10012 close to the base substrate 01, and the second main body sub-portion 10012 protruding relative to the first main body sub-portion 10011 to form a separation structure 10013 in the main body portion 1001; forming a light-emitting functional layer 130 and a second electrode 140 sequentially on the pixel defining layer; the light-emitting functional layer 130 includes a plurality of film layers, at least one of the plurality of film layers is broken at the separation structure 10013, the separation structure 10013 includes a groove 1004, and the light-emitting functional layer 130 extends into the groove 1004.

For example, as illustrated in FIG. 12 to FIG. 20, before forming the planarization layer 110 on the base substrate 01, the method for manufacturing the display substrate may include preparing the base substrate 01 on a glass carrier. For example, the base substrate 01 may be a flexible base substrate. For example, forming the base substrate 01 may include sequentially forming a first flexible material layer, a first inorganic material layer, a semiconductor layer, a second flexible material layer, and a second inorganic material layer that are stacked on the glass carrier. The first flexible material layer and the second flexible material layer may adopt materials such as polyimide (PI), polyethylene terephthalate (PET) or surface-treated polymer soft film. For example, the first inorganic material layer and the second inorganic material layer may adopt materials such as silicon nitride (SiNx) or silicon oxide (SiOx) to improve the water and oxygen resistance ability of the base substrate. The first inorganic material layer and the second inorganic material layer are further called a barrier layer. The material of the semiconductor layer adopts amorphous silicon (a-Si). For example, taking a stacked structure PI1/Barrier1/a-Si/PI2/Barrier2 as an example, a preparation process includes: first coating a layer of polyimide on a glass carrier, after solidifying into a film to form a first flexible (PI1) layer; then depositing a layer of barrier film on the first flexible layer to form a first barrier (Barrier1) layer covering the first flexible layer; then depositing an amorphous silicon film on the first barrier layer to form an amorphous silicon (a-Si) layer covering the first barrier layer; then coating a layer of polyimide on the amorphous silicon layer, after solidifying into a film to form a second flexible (PI2) layer; then depositing a barrier film on the second flexible layer to form a second barrier (Barrier2) layer covering the second flexible layer, and finally completing the preparation of the base substrate 01.

For example, as illustrated in FIG. 12 to FIG. 20, before forming the planarization layer 110 on the base substrate 01, the method for manufacturing the display substrate may include preparing other film layers 011 on the base substrate 01. Referring to the base substrate illustrated in FIG. 6, other film layers 011 may include a driving structure layer, and the driving structure layer includes a plurality of the above-mentioned pixel circuits 21. For example, forming the driving structure layer may include sequentially depositing a first insulating film and an active layer film on the base substrate 01, patterning the active layer film through a patterning process to form a buffer layer 0114 covering the entire base substrate 01, and an active layer pattern arranged on the buffer layer 0114, the active layer pattern at least including an active layer 212. Depositing a second insulating film and a first metal film sequentially, and patterning the first metal film through a patterning process to form a second insulating layer 0113 covering the active layer 212 and a first gate metal layer pattern arranged on the second insulating layer 0113, the first gate metal layer pattern at least including a gate electrode 211 and a first electrode plate 310. Depositing a third insulating film and a second metal film sequentially, and patterning the second metal film by a patterning process to form a third insulating layer 0112 covering the gate electrode 211 and a second gate metal layer pattern arranged on the third insulating layer 0112, the second gate metal layer pattern at least including a second electrode plate 320, a position of the second electrode plate 320 corresponds to a position of the first electrode plate 310. Subsequently, depositing a fourth insulating film, and patterning the fourth insulating film by a patterning process to form a fourth insulating layer 0111 covering the second electrode plate 320, the fourth insulating layer 0111 being provided with at least two first via holes N1, and parts of the fourth insulating layer 0111, the third insulating layer 0112, and the second insulating layer 0113 in the two first via holes N1 are etched away, and a surface of the active layer 212 of the active layer pattern is exposed. Subsequently, depositing a third metal film, patterning the third metal film through a patterning process, and forming a source-drain metal layer pattern on the fourth insulating layer 0111, and the source-drain metal layer pattern including at least a source electrode 210 and a drain electrode 213 in a display region. The source electrode 210 and the drain electrode 213 may be connected to the active layer 212 in the active layer pattern through the first via holes N1, respectively.

For example, referring to FIG. 6, FIG. 12 to FIG. 20, the buffer layer 0114, the second insulating layer 0113, the third insulating layer 0112, and the fourth insulating layer 0111 adopt any one or more of silicon oxide (SiOx), silicon nitride (SiNx) and oxynitride silicon (SiON), which can be a single layer, multiple layers, or a composite layer. For example, the first metal film, the second metal film, and the third metal film adopt a metal material, such as any one or more of silver (Ag), copper (Cu), aluminum (Al), titanium (Ti) and molybdenum (Mo), or alloy material of the above metals, such as aluminum neodymium alloy (AlNd) or molybdenum niobium alloy (MoNb), which can be a single-layer structure, or a multi-layer composite structure, such as Ti/Al/Ti and so on. The active layer pattern adopts any one or more of amorphous indium gallium zinc oxide (a-IGZO), zinc oxynitride (ZnON), indium zinc tin oxide (IZTO), amorphous silicon (a-Si), polysilicon (p-Si), hexathiophene, and polythiophene, that is, the present disclosure is applicable to a transistor manufactured based on oxide technology, silicon technology, and organic technology.

For example, referring to FIG. 6, FIG. 12 to FIG. 14, forming the planarization layer 110 on the base substrate 01 includes: coating a planarization thin film of an organic material on the base substrate 01 formed with above mentioned pattern, forming a planarization (PLN) layer 110 covering the entire base substrate 01, and forming a plurality of second via holes N2 in the planarization layer 110 in the display region through processes, such as masking, exposure, and development. For example, the part of the planarization layer 110 in the plurality of second via holes N2 is developed, and surfaces of the drain electrodes 213 of the transistors 21 of the pixel circuits of the plurality of sub-pixels are exposed respectively.

For example, referring to FIG. 6, FIG. 12 to FIG. 14, depositing a first conductive film 012 on the planarization layer 110, and patterning the first conductive film 012 to form a first electrode 120. For example, the first electrode 120 is connected to the drain electrode 213 of the transistor 21 through the second via hole N2 in the planarization layer 110.

For example, referring to FIG. 12 to FIG. 16, forming the second conductive film 013 on the first electrode 120 and patterning the second conductive film 013 to form a sacrificial structure 150.

For example, a material of the first conductive film includes a conductive metal oxide, and a material of the second conductive film includes a metal material. For example, the conductive metal oxide includes indium tin oxide, and the metal includes aluminum or silver. For example, the first conductive film or the second conductive film may be a single-layer structure, or a multi-layer composite structure.

For example, the sacrificial structure 150 may adopt any one of aluminum (Al), silver (Ag), and metal stacked layer formed of titanium (Ti)/aluminum (Al)/titanium (Ti).

For example, referring to FIG. 12 to FIG. 16, when forming the first electrodes 120, it further includes forming a first spacing region 1210 between adjacent first electrodes 120 through a patterning process. For example, the first spacing region 1210 may separate the first electrodes 120 of adjacent sub-pixels.

For example, referring to FIG. 6, FIG. 12 to FIG. 16, when forming the first electrode 120, it further includes forming a second spacing region 1510 between adjacent sacrificial structures 150 through a patterning process. In the X direction, an orthographic projection of the first spacing region 1210 on the base substrate 01 falls within an orthographic projection of the second spacing region 1510 on the base substrate, and the minimum dimension of the second spacing region 1510 is greater than or equal to the minimum dimension of the first spacing region, and therefore, the minimum dimension of the first main body sub-region 10011 in the X direction may be larger than the dimension of the first spacing region 1210, so that a structure of the main body portion 1001 is more stable.

For example, referring to FIG. 6, FIG. 12 to FIG. 16, after patterning the pixel defining film 014, the pixel defining layer 100 that has been formed includes a plurality of openings 1002. In the arrangement direction of adjacent sub-pixels (that is, in the X direction), the minimum dimension of the opening 1002 is smaller than the minimum dimension of the sacrificial structure 150, and an orthographic projection of the opening 1002 on the base substrate 01 falls within an orthographic projection of the sacrificial structure 150 on the base substrate 01. Therefore, an undercut structure can be formed in the main body portion 1001 after the sacrificial structure 150 is subsequently removed. In the X direction, for example, the minimum dimension of the opening 1002 may be 50%-95% of the minimum dimension of the sacrificial structure 150. For example, the minimum dimension of the opening 1002 may be 60%-85% of the minimum dimension of the sacrificial structure 150. For example, the minimum dimension of the opening 1002 may be 70%-80% of the minimum dimension of the sacrificial structure 150.

For example, referring to FIG. 6, FIG. 12 to FIG. 18, when forming the pixel defining layer 100, it further includes forming a support structure 10016 on a side of the pixel defining layer 100 away from the base substrate, an orthographic projection of the support structure 10016 on the base substrate 01 at least partially overlaps with an orthographic projection of the second spacing region 1510 on the base substrate 01. For example, the support structure 10016 can be integrally formed with the main body portion 1001, be made of the same material as the main body portion 1001, and be configured to support a FMM (high-precision mask) during an evaporation process of the display substrate.

For example, with reference to FIG. 6, FIG. 12 to FIG. 19, a thickness of the second conductive film 013 is 1-3 times a thickness of the first conductive film 012; a thickness of the pixel defining film 014 is 3-8 times the thickness of the second conductive film 013. That is, a thickness of the first main body sub-region 10011 may be about 1-3 times a thickness of the first electrode 120, and a thickness of the main body portion 1001 may be 3-8 times a thickness of the sacrificial structure 150. Therefore, according to actual layout design requirements, the main body portion can form an effective separation structure 10013 to disconnect at least one film layer of the light-emitting functional layer.

For example, the thickness of the second conductive film 013 is 1.5-3 times the thickness of the first conductive film 012; the thickness of the pixel defining film 014 is 5-8 times the thickness of the second conductive film 013. For example, the thickness of the second conductive film 013 is 1.5-2.5 times the thickness of the first conductive film 012; the thickness of the pixel defining film 014 is 4-7 times the thickness of the second conductive film 013. For example, the thickness of the second conductive film 013 is 1.8-2.5 times the thickness of the first conductive film 012; the thickness of the pixel defining film 014 is 4.5-6.5 times the thickness of the second conductive film 013. For example, the thickness of the second conductive film 013 is 2-2.5 times the thickness of the first conductive film 012; the thickness of the pixel defining film 014 is 4.5-6.5 times the thickness of the second conductive film 013. For example, the thickness of the second conductive film 013 is 2.5-3 times the thickness of the first conductive film 012; the thickness of the pixel defining film 014 is 5.5-7.5 times the thickness of the second conductive film 013.

For example, referring to FIG. 6, FIG. 12 to FIG. 19, after forming the sacrificial structure 150 and before removing the sacrificial structure 150, the manufacturing method further includes: performing heat treatment on the display substrate 01 to crystallize the first electrode 120.

For example, referring to FIG. 6, FIG. 12 to FIG. 19, the sacrificial structure 150 may be etched away so as to be removed by adopting a wet etching process.

For example, referring to FIG. 6, FIG. 12 to FIG. 19, during the heat treatment of the display substrate 01, the first electrode 120 (for example, the first electrode adopting indium tin oxide) will be crystallized at a high temperature, so that a risk of being etched and removed by the etching solution can be reduced during a subsequent process of removing the sacrificing the structure 150.

For example, referring to FIG. 6, FIG. 12 to FIG. 19, in the case where the material of the second conductive film 013 adopt metal such as aluminum or silver, acidic etching solution can be adopted to etch an intermediate film layer (that is, the sacrificial structure 150) made of metal when the sacrificial structure 150 is etched and removed by a wet etching process. For example, the acidic etching solution may include material such as $HNO_3$ (nitric acid), but is not limited thereto, which is not limited in the embodiments of the present disclosure.

For example, referring to FIG. 6, FIG. 12 to FIG. 19, when removing the sacrificial structure 150, removal time and removal degree of the sacrificial structure 150 can be controlled according to actual process requirements. For example, the removal time and removal degree can be arranged relatively conservatively, so that the sacrificial structure 150 cannot be completely removed, but can have a certain residual portion 90 (as illustrated in FIG. 5) which can be located in the groove 10014, and do not affect the light-emitting performance of the display substrate.

For example, referring to FIG. 6, FIG. 12 to FIG. 19, when forming the light-emitting functional layer 130, at least one of the plurality of film layers of the light-emitting functional layer 130 is broken at the separation structure 10013, and a part of the light-emitting functional layer 130 is arranged on a side of the main body portion 1001 away from the base substrate 01, a part of the light-emitting functional layer 130 is located in the opening 1002 and extends into the groove 10014. For example, the second electrode 140 is arranged on a side of the light-emitting functional layer 130 away from the base substrate, and the second electrode 140 may not be broken at the separation structure 10013 to ensure continuity between adjacent sub-pixels 10.

For example, referring to FIG. 6, FIG. 12 to FIG. 19, the method for manufacturing the display substrate further includes forming an encapsulation layer 41, that is, forming a first encapsulation layer 411, a second encapsulation layer 412, and a third encapsulation layer 413 on the side of the second electrode 140 away from the base substrate 01 sequentially, so that the display substrate has a good encapsulation effect to prevent intrusion of water vapor or impurity.

The following statements need to be explained.

(1) The drawings of the embodiments of the present disclosure only relate to the structure related to the embodiment of the present disclosure, and other structures can refer to the common design(s).

(2) In case of no conflict, the features in the same embodiment and in different embodiments of the present disclosure can be combined with each other.

The above are only specific implementations of the present disclosure, and is not used to limit the protection scope of the present disclosure. The protection scope of the present disclosure should be based on the protection scope of the claims.

The invention claimed is:

1. A display substrate, comprising:
   a base substrate;
   a plurality of sub-pixels, wherein each of the plurality of sub-pixels comprises a light-emitting element, the light-emitting element comprises a light-emitting functional layer, and a first electrode and a second electrode that are located on both sides of the light-emitting functional layer in a direction perpendicular to the base substrate, the first electrode is located between the light-emitting functional layer and the base substrate, and the light-emitting functional layer comprises a plurality of film layers;
   a pixel defining layer, comprising a main body portion and a plurality of openings, wherein each of the plurality of the openings is defined by the main body portion, and the opening exposes at least a part of the first electrode; and
   a planarization layer, arranged between the base substrate and the pixel defining layer,
   wherein the main body portion comprises a first main body sub-portion and a second main body sub-portion, the first main body sub-portion is located on a side of the second main body sub-portion close to the base substrate,
   the second main body sub-portion protrudes relative to the first main body sub-portion to form a separation structure, at least one of the plurality of film layers is broken at the separation structure of the main body portion,
   an orthographic projection of a part of the light-emitting functional layer that is on a side of a part of the first electrode located in the opening away from the base substrate on the base substrate at least partially overlaps with an orthographic projection of a part of the light-emitting functional layer located on a side of the main body portion away from the base substrate on the base substrate.

2. The display substrate according to claim 1, wherein for a same opening, the separation structure in the pixel defining layer is arranged in unclosed ring-shape in a circumferential direction of the opening, and second electrodes of adjacent light-emitting elements are at least partially connected at a notch of the unclosed ring-shape,
   a length of the notch of the unclosed ring-shape is 5-20 microns.

3. The display substrate according to claim 1, wherein the minimum slope angle between at least part of a side surface of the second main body sub-portion and a plane parallel to the base substrate is in a range from 60° to 90°.

4. The display substrate according to claim 1, wherein in an arrangement direction of adjacent sub-pixels, the minimum dimension of the opening is 1.2-1.5 times the maximum dimension of the first main body sub-portion.

5. The display substrate according to claim 1, wherein in an arrangement direction of adjacent sub-pixels, the maximum dimension of the first main body sub-portion is 0.4-0.8 times the maximum dimension of the second main body sub-portion;
   in the direction perpendicular to the base substrate, the maximum dimension of the first main body sub-portion is 1-1.8 times the maximum dimension of the second main body sub-portion.

6. The display substrate according to claim 1, wherein the first electrode comprises a crystallized conductive metal oxide.

7. The display substrate according to claim 1, wherein an orthographic projection of a part of the light-emitting functional layer on a side of the second main body sub-portion away from the base substrate on the base substrate, at least partially overlaps with an orthographic projection of a part of the light-emitting functional layer located in the opening on the base substrate.

8. The display substrate according to claim 1, wherein an orthographic projection of a part of the second electrode on a side of the second main body sub-portion away from the base substrate on the base substrate, at least partially overlaps with an orthographic projection of a part of the second electrode located in the opening on the base substrate.

9. The display substrate according to claim 1, wherein the separation structure comprises a groove, and the light-emitting functional layer extends into the groove;
   the display substrate further comprises a residual portion, the residual portion is located in the groove, and an orthographic projection of the residual portion on the base substrate falls within an orthographic projection of the separation structure on the base substrate.

10. A display device, comprising the display substrate according to claim 1.

11. A manufacturing method of a display substrate, comprising:
    forming a planarization layer on the base substrate;
    forming a first conductive film on the planarization layer, and patterning the first conductive film to form a first electrode;
    forming a second conductive film on the first electrode, and patterning the second conductive film to form a sacrificial structure;
    forming a pixel defining film on the sacrificial structure, and patterning the pixel defining film to form a pixel defining layer, the pixel defining layer comprising a main body portion and a plurality of openings, each of the plurality of openings exposing at least a part of the first electrode;
    removing the sacrificial structure so that the main body portion comprises a first main body sub-portion and a second main body sub-portion, the first main body sub-portion being located on a side of the second main body sub-portion close to the base substrate, and the second main body sub-portion protruding relative to the first main body sub-portion to form a separation structure in the main body portion;
    forming a light-emitting functional layer and a second electrode sequentially on the pixel defining layer, wherein the light-emitting functional layer comprises a plurality of film layers, at least one of the plurality of film layers is broken at the separation structure,
    the separation structure comprises a groove, and the light-emitting functional layer extends into the groove.

12. The manufacturing method according to claim 11, wherein
    forming the first electrode comprises: forming a first spacing region between adjacent first electrodes;

forming the sacrificial structure comprises: forming a second spacing region between adjacent sacrificial structures, in an arrangement direction of adjacent sub-pixels, an orthographic projection of the first spacing region on the base substrate falls within an orthographic projection of the second spacing region on the base substrate, and the minimum dimension of the second spacing region is greater than or equal to the minimum dimension of the first spacing region.

13. The manufacturing method according to claim 11, wherein in an arrangement direction of adjacent sub-pixels, the minimum dimension of the opening is smaller than the minimum dimension of the sacrificial structure, and an orthographic projection of the opening on the base substrate falls within an orthographic projection of the sacrificial structure on the base substrate.

14. The manufacturing method according to claim 12, further comprising:
forming a support structure located on a side of the pixel defining layer away from the base substrate, wherein an orthographic projection of the support structure on the base substrate at least partially overlaps with an orthographic projection of the second spacing region on the base substrate.

15. The manufacturing method according to claim 11, wherein a thickness of the second conductive film is 1-3 times a thickness of the first conductive film; a thickness of the pixel defining film is 3-8 times the thickness of the second conductive film.

16. The manufacturing method according to claim 11, wherein a material of the first conductive film comprises conductive metal oxide, and a material of the second conductive film comprises metal.

17. The manufacturing method according to claim 16, wherein the conductive metal oxide comprises indium tin oxide; the metal comprises any one of aluminum, silver, and a metal stacked layer formed of titanium/aluminum/titanium.

18. The manufacturing method according to claim 16, after forming the sacrificial structure and before removing the sacrificial structure, the manufacturing method further comprises:
performing heat treatment on the display substrate to crystallize the first electrode.

19. The manufacturing method according to claim 18, wherein removing the sacrificial structure comprises:
etching and removing the sacrificial structure by using a wet etching process.

20. The manufacturing method according to claim 19, wherein the material of the second conductive film comprises metal, and etching and removing the sacrificial structure by using a wet etching process comprises: using an acidic etching solution to etch an intermediate film layer made of the metal.

* * * * *